(12) United States Patent
Kathirgamanathan et al.

(10) Patent No.: US 7,211,334 B2
(45) Date of Patent: May 1, 2007

(54) ELECTROLUMINESCENT MATERIALS AND DEVICES

(75) Inventors: Poopathy Kathirgamanathan, North Harrow (GB); Subramaniam Ganeshamurugan, London (GB); Sivagnanasundram Surendrakumar, London (GB)

(73) Assignee: Oled-T Limited, Enfield (GB)

( * ) Notice: Subject to any disclaimer, the term of this patent is extended or adjusted under 35 U.S.C. 154(b) by 308 days.

(21) Appl. No.: 10/483,137

(22) PCT Filed: Jul. 9, 2002

(86) PCT No.: PCT/GB02/03163

§ 371 (c)(1),
(2), (4) Date: Mar. 5, 2004

(87) PCT Pub. No.: WO03/006573

PCT Pub. Date: Jan. 23, 2003

(65) Prior Publication Data

US 2005/0175855 A1 Aug. 11, 2005

(30) Foreign Application Priority Data

Jul. 9, 2001 (GB) .................. 0116644.6

(51) Int. Cl.
*H01L 51/54* (2006.01)
*H05B 33/14* (2006.01)

(52) U.S. Cl. ............. 428/690; 428/917; 313/504; 313/506; 257/E51.043; 548/105; 548/106

(58) Field of Classification Search ............ 548/105, 548/106
See application file for complete search history.

(56) References Cited

U.S. PATENT DOCUMENTS

| | | | |
|---|---|---|---|
| 4,070,536 A * | 1/1978 | Konotsune et al. ...... 548/369.4 |
| 4,146,540 A * | 3/1979 | Avar et al. .................. 548/105 |
| 4,356,429 A | 10/1982 | Tang |
| 4,455,364 A | 6/1984 | Sasa |
| 4,720,432 A | 1/1988 | VanSlyke et al. |
| 4,885,211 A | 12/1989 | Tang et al. |
| 5,128,587 A | 7/1992 | Skotheim et al. |
| 5,281,489 A | 1/1994 | Yoshihiko et al. |
| 5,755,999 A | 5/1998 | Shi et al. |
| 5,757,026 A | 5/1998 | Forrest et al. |
| 5,807,627 A | 9/1998 | Friend et al. |
| 6,153,726 A | 11/2000 | Kathirgamanathan et al. |
| 2006/0035110 A1 * | 2/2006 | Kathirgamanathan et al. ........ 428/690 |

FOREIGN PATENT DOCUMENTS

| EP | 0 087 309 A | 8/1983 |
|---|---|---|
| EP | 0 278 629 A | 8/1988 |
| EP | 0 461 542 A | 12/1991 |
| EP | 0 556 005 A | 8/1993 |
| EP | 0 569 827 A | 11/1993 |
| EP | 0 744 451 A | 11/1996 |
| EP | 0 936 844 A | 8/1999 |
| JP | 61037887 | 2/1986 |
| JP | 1-256584 | 10/1989 |
| JP | 1-282291 | 11/1989 |
| JP | 06 145146 A | 5/1994 |
| WO | WO 90/13148 | 11/1990 |
| WO | WO 92/03490 | 3/1992 |
| WO | WO 98/02018 | 1/1998 |
| WO | WO 98/55561 | 12/1998 |
| WO | WO 98/58037 | 12/1998 |
| WO | WO 00/26323 | 5/2000 |
| WO | WO 00/32717 | 6/2000 |
| WO | WO 00/32718 | 6/2000 |
| WO | WO 00/32719 | 6/2000 |
| WO | WO 00/44851 | 8/2000 |
| WO | WO 00/60669 | 10/2000 |
| WO | WO 02/43444 | 5/2002 |
| WO | WO 02/43446 | 5/2002 |
| WO | WO 02/43447 | 5/2002 |
| WO | WO 02/086014 | 10/2002 |
| WO | WO 02/086015 | 10/2002 |
| WO | WO 02/087283 | 10/2002 |
| WO | WO 02/087288 | 10/2002 |
| WO | WO 02/090465 | 11/2002 |
| WO | WO 02/090466 | 11/2002 |
| WO | WO 02/091493 | 11/2002 |
| WO | WO 02/102924 | 12/2002 |
| WO | WO 03/006573 | 1/2003 |
| WO | WO 03/014256 | 2/2003 |

OTHER PUBLICATIONS

Y. Akama et al., "Thermal decompositions of complexes of Al, Ga, In, Cr, Fe and Bi ions with 1-phenyl-3-methyl-4-benzoyl-5-pyrazolone", Journal of Thermal Analysis, vol. 44 (1995), pp. 1107-1112.*
HCA 123:101329 (for Y. Akama et al., Journal of Thermal Analysis, vol. 44 (1995), pp. 1107-1112).*
Y. Hamada, et al., Blue Electroluminescence In Thin Films of Azomethin-Zinc Complexes, Japanese Journal of Applied Physics, vol. 32, Apr. 1, 1993, No. 4A, pp. L511-L513.
M. Berggren, et al., Ultraviolet Electroluminescence from an Organic Light Emitting Diode, Advanced Materials, 7 (1995), Nov. No. 11; pp. 900-903.
N. Armaroli, Luminescence properties of Eu3+, Tb3-, and Gd3+ complexes of the hexadentate N-donor podand tris-[3-(2-pyridyl) pyrazol-1yl] pyrazol-1yl] hydroborate, Chemical Physics Letters 276, Sep. 1997, pp. 435-440.
N.C. Greenham, et al., Measurement of absolute photoluminescence quantum efficiencies in conjugated polymers, Chemical Physics Letters, Jul. 1995, 241, pp. 89-96.
L. Liu, et al., Europium complexes as emitters in organic electroluminescent devices, Synthetic Metals 91, 1997, pp. 267-269.

(Continued)

Primary Examiner—Marie Yamnitzky
(74) Attorney, Agent, or Firm—David Silverstein; Andover-IP-Law

(57) ABSTRACT

An electroluminescent material is a metal complex, preferably aluminium, of a substituted pyrazol-5-one.

16 Claims, 19 Drawing Sheets

OTHER PUBLICATIONS

S. Dirr, et al., Luminescence enhancement in microcavity organic multilayer structures, Synthetic Metals, 9, 1997, pp. 53-56.

J. Kido, et al., White-Light Emitting Organic Electroluminescent Device Using Lanhanide Complexes, Japanese Journal of Applied Physics No. 35, 1996, pp. L304-L396.

K. Hensen, et al. Darstellung Von N-BZW. O-Chlormethylsilyl-Derivaten der Armine 1,2,3,4-Tetrahydro-1, 10-Phenanthrolin und 8-Hydroxychinolin, J. of Organometallic Chemistry, 209, 1981, pp. 17-23.

J. Kido, et al. Organic Electroluminescent Devices Using Lanthanide Complexes; Department of Materials Science and Engineering, 1995, Yamagata University, Yamagata Japan, pp. 110-111, source not given.

C.J. Kepert, et al., Structural Systematics of Rare Earth Complexes; V+ The Hydrated 1:1 Adducts of 2,2':6'2'-Terpyrid with Lanthanoid (III) Chlorides, Australisan Journal of Chemistry, 1994, 47, pp. 365-384.

K. Machida, et al., Redox Behavior and Luminescence Property of Europium Polymer Complexes, Department of Applied Chemistry, Faculty of Engineering, Osaka University, Osaka, Japan 1991, pp. 70-71, source not given.

K. Hayashi, et al., Syntheses and Structural Studies of Lanthanide Mixed Ligand Complexes containing B-diketone, Department of Chemistry, Faculty of Science, Ochanomizu University, Tokyo, Japan, 1996, pp. 210-211, source not given.

K. Tsuchiya, et al., Complex Formation and Its High Dispersion in the Simultaneous Vacuum Deposition of Copper and Phthalocyanine, Faculty of Engineering, Yamagata University, Yonezawa, Japan 1998, pp. 149-154, source not given.

L. K. Templeton, et al., Anormalous Scattering by Praseodymium Samarium and Gadolinium and Structures of their Ethylenediaminetetraacetate (edta) Salts, Acta, Cryst. (1982), B38, pp. 2155-2159.

J. Kido, et al., Bright red light-emitting organic electroluminescent devices having a europium complex as an emitter, Applied Physics Letters, 65 (17), Oct. 1994, pp. 2124-2126.

T. Wakimoto, et al., Organic EL cells with high luminous efficiency, Applied Science 113/114 (1997) p. 698-704.

J. Kido, et al., Electroluminescence in a Terbium Complex, Chemistry Letters, The Chemistry Society of Japan, 1990, pp. 657-660.

J. Kido, et al., Multilayer White Light-Emitting Organic Electroluminescent Device, Science, vol. 267, Mar. 1995, pp. 1332-1334.

H. Spreitzer, et al., Soluble Phenyl-Substituted PPVs-New Materials for Highly Efficient Polymer LEDs, Advanced Materials, 10 (1998), No. 16, pp. 1340-1343.

C. C. Wu, et al., Poly(p-phenylene vinylene)/tris(8-hydroxy) quinoline aluminum heterostructures light emitting diode, 320 Applied Physics Letters 66 (1995) Feb. No. 6, Woodbury, NY, US, pp. 653-655.

A. MacDiarmid, et al., Polyanilines: A Novel Class of Conducting Polymers, Faraday Discussions, Chem. Soc. 88 1989, pp. 317-331.

Marchetti, F., et al., Copper and calcium complexes with anionic 02-donor 4-tert-butylacetyl-3-methyl-1-phenylpyrazo 1-5-onato, J. Chem. Soc. Dalton Trans., No. 19, 1998, pp. 3325-3333.

Gao Xi-Cun et al., Photoluminescence and electroluminescence of a seris of terbium complexes, Synthetic Metals, Feb. 1999, vol. 99, No. 2, pp. 127-132.

Gao D-Q et al., An organic electroluminescent device made from a gadolinium complex, Solid State Communications, 2002, vol. 121, No. 2-3, pp. 145-147.

Zhu W. et al., Red electroluminescence from a novel europium beta-diketone complex with acylpyrazolone ligand, Synthetic Metals, vol. 111-112 (2000), pp. 445-447.

Moon D. G. et al., Efficient single layer organic light emitting diodes based on a terbium pyrazolone complex, Synthetic Metals, Sep. 2001, vol. 123, No. 2, pp. 355-357.

Pettinari C. et al., Tin(IV) and organotin(IV) derivatives of novel beta-diketones, Inorg. Chim. Acta, vol. 262, 1997, pp. 33-46.

Pettinari C. et al., Tin(IV) and organotin(IV) derivatives of novel beta-diketones, Inorg. Chim. Acta, vol. 257, 1997, pp. 37-48.

Pettinari C. et al., Synthesis and characterization of some tin (II) and tin(IV) derivatives of 4-acyl-5-pyrazolones, Polyhedron, vol. 13, No. 6-7, 1994, pp. 939-950.

* cited by examiner

α -NPB

β -NPD mTADATA

Alq

Bebq

BAlq1

ZnPBO

ZnPBT

DTVb1

ELECTROLUMINESCENT MATERIALS AND DEVICES

The present invention relates to electroluminescent materials and devices incorporating electroluminescent materials.

Materials which emit light when an electric current is passed through them are well known and used in a wide range of display applications. Liquid crystal devices and devices which are based on inorganic semiconductor systems are widely used, however these suffer from the disadvantages of high energy consumption, high cost of manufacture, low quantum efficiency and the inability to make flat panel displays.

Organic polymers have been proposed as useful in electroluminescent devices, but it is not possible to obtain pure colours, they are expensive to make and have a relatively low efficiency.

Another compound which has been proposed is aluminium quinolate, but this requires dopants to be used to obtain a range of colours and has a relatively low efficiency.

Patent application WO98/58037 describes a range of lanthanide complexes which can be used in electroluminescent devices which have improved properties and give better results. Patent Applications PCT/GB98/01773, PCT/GB99/03619, PCT/GB99/04030, PCT/GB99/04024, PCT/GB99/04028, PCT/GB00/00268 describe electroluminescent complexes, structures and devices using rare earth chelates.

Hitherto electroluminescent metal complexes have been based on a rare earth, transition metal, lanthanide or an actinide or have been quinolates such as aluminium quinolate.

We have now invented electroluminescent materials which do not include a rare earth, lanthanide or an actinide.

According to the invention there is provided an electroluminescent compound which has the formula

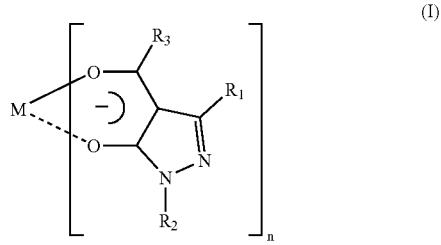

(I)

where M is a metal other than a rare earth, a lanthanide or an actinide; n is the valency of M; $R_1$, $R_2$ and $R_3$ which may be the same or different are selected from hydrogen, hydrocarbyl groups, substituted and unsubstituted aliphatic groups substituted and unsubstituted aromatic, heterocyclic and polycyclic ring structures, fluorocarbons such as trifluoryl methyl groups, halogens such as fluorine or thiophenyl groups or nitrile; $R_1$, and $R_3$ can also be form ring structures and $R_1$, $R_2$ and $R_3$ can be copolymerisable with a monomer e.g. styrene.

The invention also provides an electroluminescent device comprising (i) a first electrode, (ii) an electroluminescent layer comprising a layer of a complex of formula (I) and (iii) a second electrode.

Figure 1:
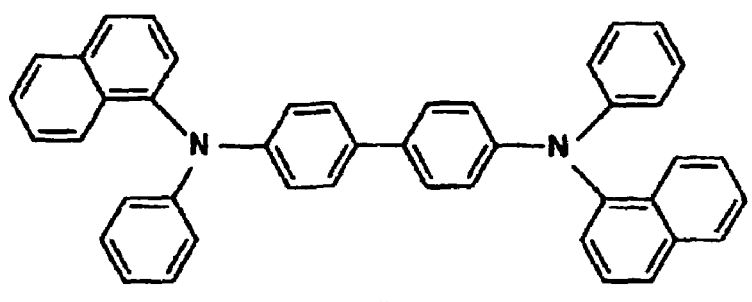
FIGS. 1–5 show exemplary hole transmitting materials in accordance with this invention.
Figure 1:
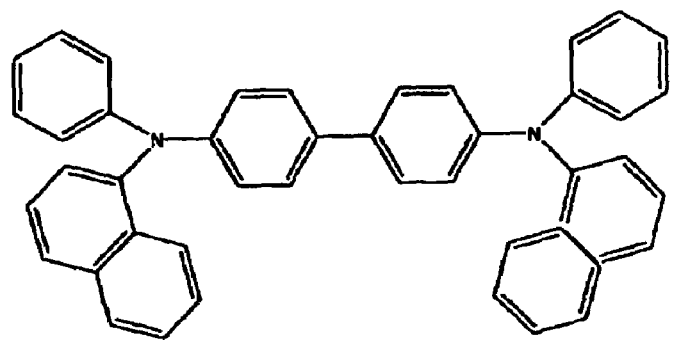
Figure 1:
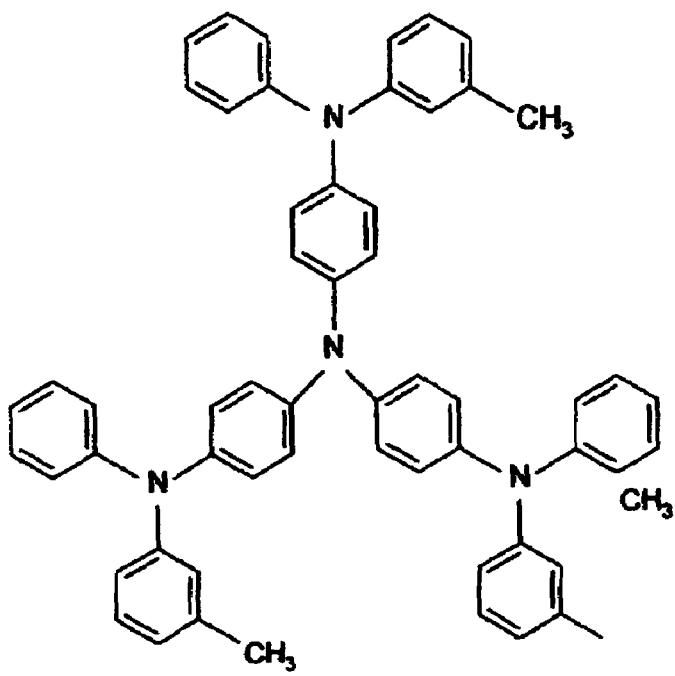
Figure 2:
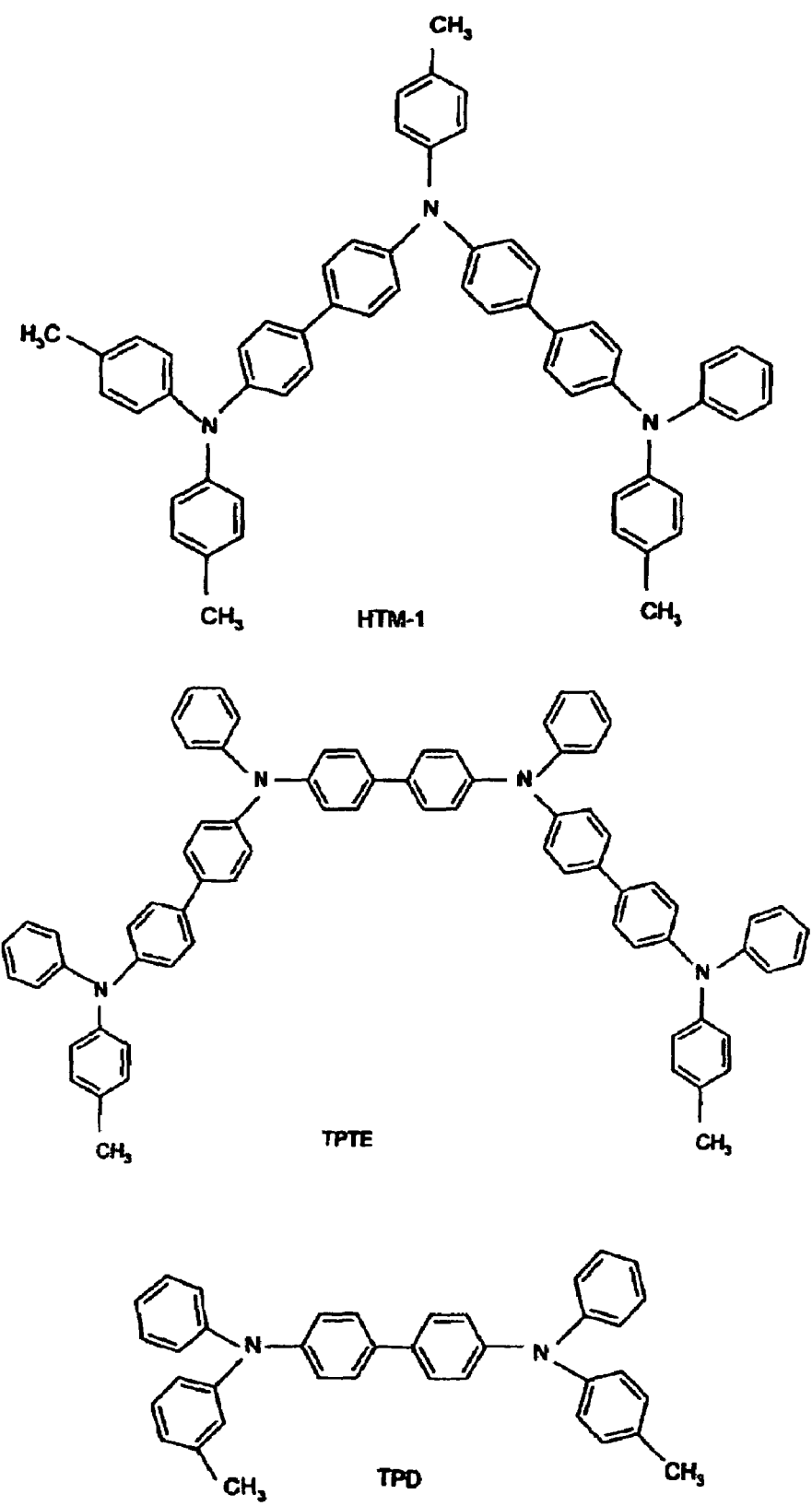
Figure 3:
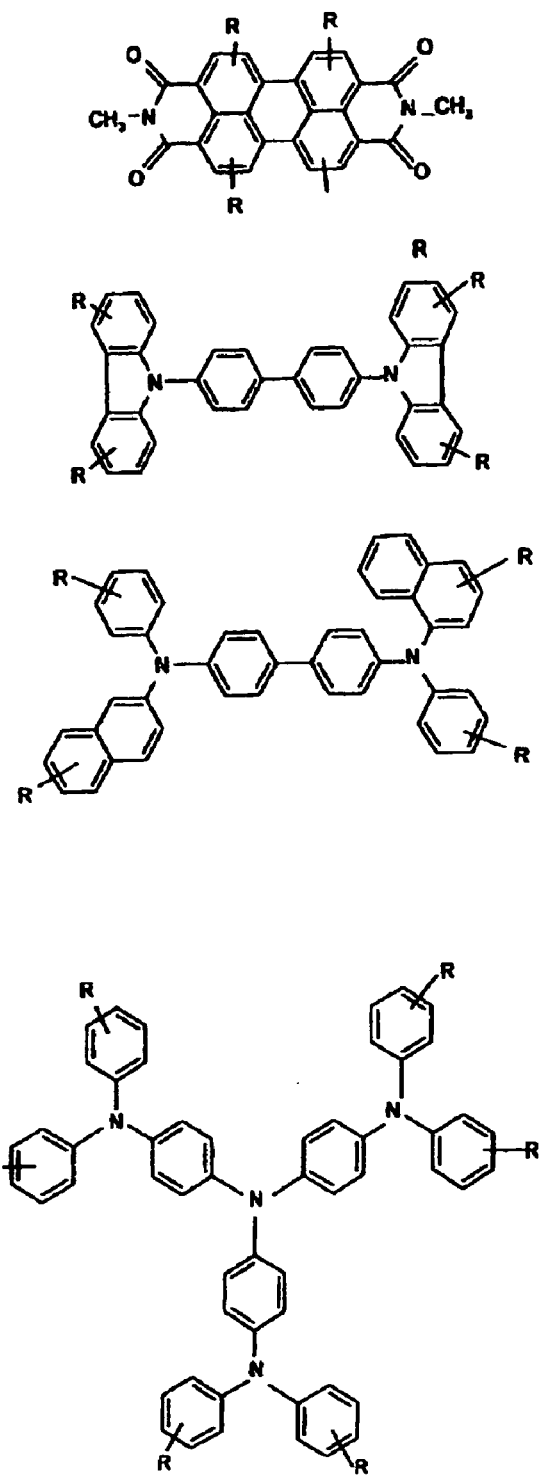
Figure 4:
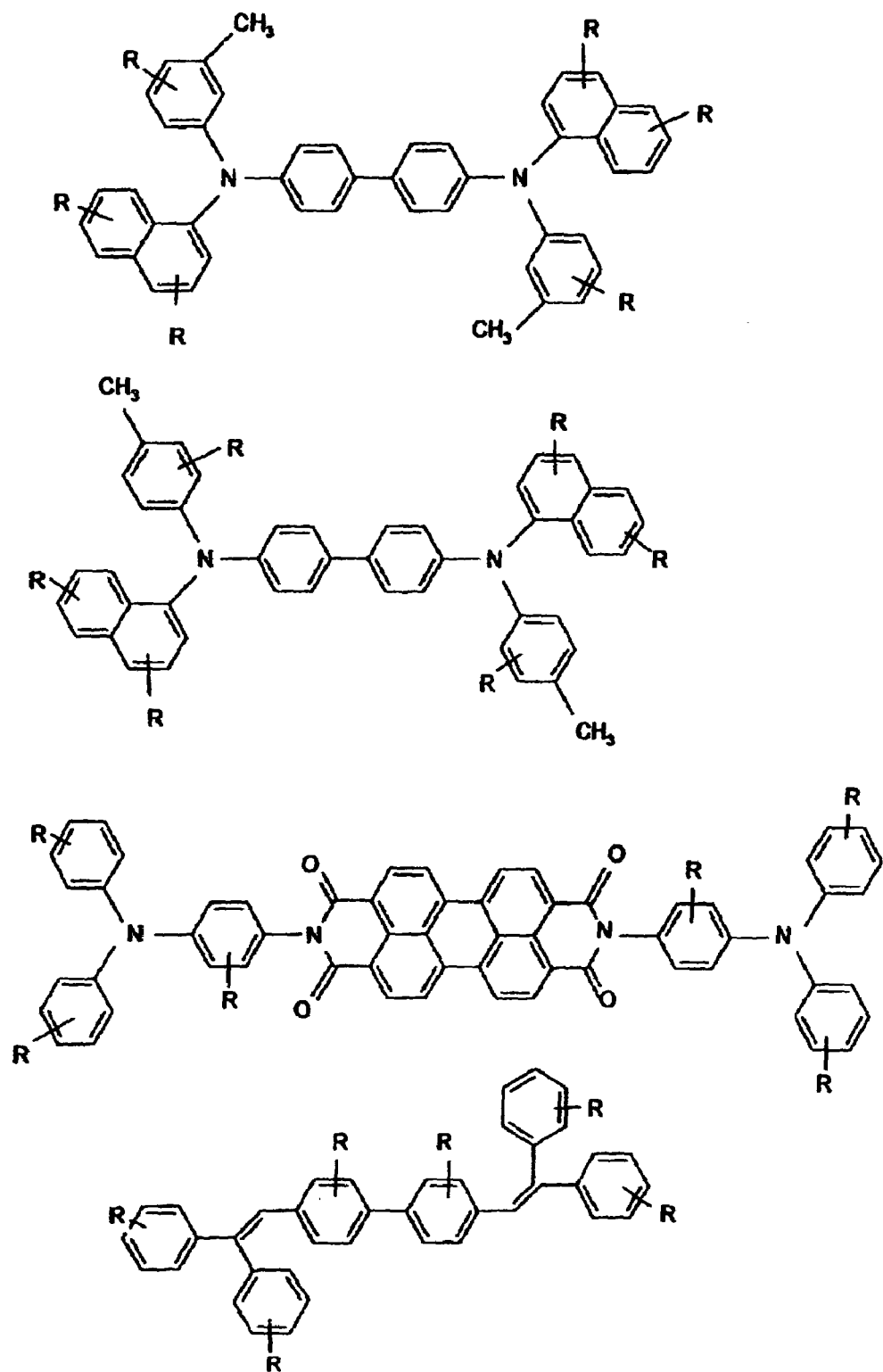
Figure 5:
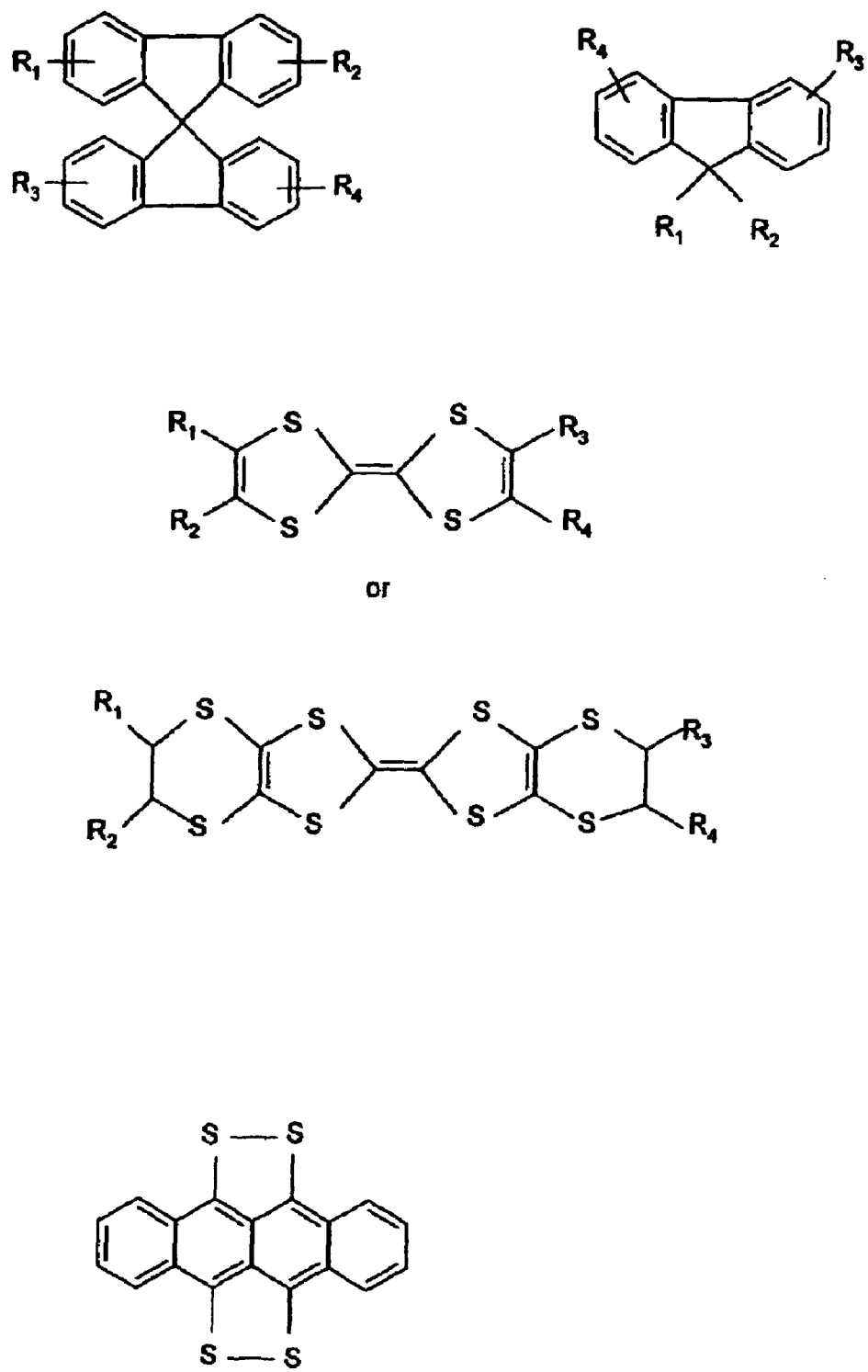

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

$R_1$ and $R_2$ can be $Ph_1$ and $Ph_2$ and at least one of $Ph_1$ and $Ph_2$ is preferably a substituted or unsubstituted aromatic compound and the other moiety is selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine; substituted and unsubstituted fused aromatic, heterocyclic and polycyclic ring structures and can be copolymerisable with a monomer e.g. styrene, fluorocarbons such as trifluoryl methyl groups, halogens such as fluorine. Examples include aliphatic, aromatic and heterocyclic alkoxy, aryloxy and carboxy groups, substituted and substituted phenyl, fluorophenyl, biphenyl, phenanthrene, anthracene, naphthyl and fluorene groups, alkyl groups such as t-butyl, heterocyclic groups such as carbazole. A preferred group is methyl.

Examples of $R_3$ are C1 to C5 alkyl groups such as methyl, ethyl, propyl, butyl, pentyl such as $(CH_2)(CH_3)_3$, groups and phenyl groups.

M can be any metal compound selected from non rare earth metals e.g. lithium, sodium, potassium, rubidium, caesium, beryllium, magnesium, calcium, strontium, barium, copper, silver, gold, zinc, boron, aluminium, gallium, indium, germanium, tin, antimony, lead, manganese, iron, ruthenium, osmium, cobalt, osmium, rhodium, iridium, nickel, palladium, platinum, cadmium, nickel, chromium and metals of the first, second and third groups of transition metals. etc. which emits light when an electric current is passed through it.

When M is platinum or palladium the complex can be non-stoichiometric i.e. of formula $M_xL_y$ where M is the metal and L is the organic ligand. In a stoichiometric complex x will be one and y will be the valence state of the metal, in a non-stoichiometric complex x and y can have different values e.g. x is two and y is three. It is possible that some kind of linked or polymeric structure is formed and/or the metal is present in more than one valence state.

A preferred metal is aluminium and $R_3$ is preferably a phenyl or substituted phenyl group.

Preferably there is a hole transmitting layer deposited on the transparent substrate and the electroluminescent material is deposited on the hole transmitting layer. The hole transmitting layer serves to transport holes and to block the electrons, thus preventing electrons from moving into the electrode without recombining with holes. The recombination of carriers therefore mainly takes place in the emitter layer.

Hole transmitting layers are used in small molecule based polymer electroluminescent devices and in electroluminescent devices based on rare earth metal complexes and any of the known hole transmitting materials in film form can be used.

Hole transmitting layers are used in polymer electroluminescent devices and any of the known hole transmitting materials in film form can be used.

The hole transmitting layer can be made of a film of an aromatic amine complex such as poly (vinylcarbazole), N,N'-diphenyl-N,N'-bis (3-methylphenyl)-1,1'-biphenyl-4,4'-diamine (TPD), an unsubstituted or substituted polymer of an amino substituted aromatic compound, a polyaniline, substituted polyanilines, polythiophenes, substituted polythiophenes, polysilanes etc. Examples of polyanilines are polymers of

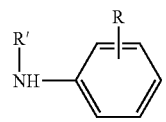

(II)

where R is in the ortho- or meta-position and is hydrogen, C1–18 alkyl, C1–6 alkoxy, amino, chloro, bromo, hydroxy or the group

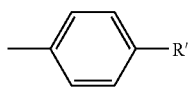

where R is alkyl or aryl and R' is hydrogen, C1–6 alkyl or aryl with at least one other monomer of the formula immediately above.

Polyanilines which can be used in the present invention have the general formula

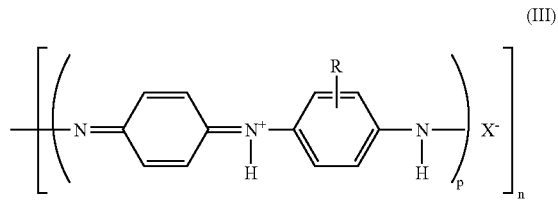

(III)

where p is from 1 to 10 and n is from 1 to 20, R is as defined above and X is an anion, preferably selected from Cl, Br, $SO_4$, $BF_4$, $PF_6$, $H_2PO_3$, $H_2PO_4$, arylsulphonate, arenedicarboxylate, polystyrenesulphonate, polyacrylate alkysulphonate, vinylsulphonate, vinylbenzene sulphonate, cellulosesulphonate, camphor sulphonates, cellulose sulphate or a perfluorinated polyanion.

Examples of arylsulphonates are p-toluenesulphonate, benzenesulphonate, 9,10-anthraquinone-sulphonate and anthracenesulphonate, an example of an arenedicarboxylate is phthalate and an example of arenecarboxylate is benzoate.

We have found that protonated polymers of the unsubstituted or substituted polymer of an amino substituted aromatic compound such as a polyaniline are difficult to evaporate or cannot be evaporated, however we have surprisingly found that if the unsubstituted or substituted polymer of an amino substituted aromatic compound is de-protonated it can be easily evaporated i.e. the polymer is evaporable.

Preferably evaporable de-protonated polymers of unsubstituted or substituted polymer of an amino substituted aromatic compound are used. The de-protonated unsubstituted or substituted polymer of an amino substituted aromatic compound can be formed by deprotonating the polymer by treatment with an alkali such as ammonium hydroxide or an alkali metal hydroxide such as sodium hydroxide or potassium hydroxide.

The degree of protonation can be controlled by forming a protonated polyaniline and de-protonating. Methods of preparing polyanilines are described in the article by A. G. MacDiarmid and A. F. Epstein, Faraday Discussions, Chem Soc. 88 P319 1989.

The conductivity of the polyaniline is dependant on the degree of protonation with the maximum conductivity being when the degree of protonation is between 40 and 60% e.g. about 50% for example.

Preferably the polymer is substantially fully de-protonated.

A polyaniline can be formed of octamer units i.e. p is four e.g.

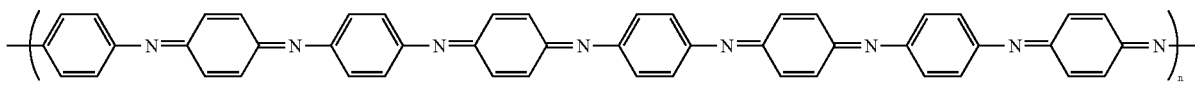

The polyanilines can have conductivities of the order of $1 \times 10^{-1}$ Siemen $cm^{-1}$ or higher.

The aromatic rings can be unsubstituted or substituted e.g. by a C1 to 20 alkyl group such as ethyl.

The polyaniline can be a copolymer of aniline and preferred copolymers are the copolymers of aniline with o-anisidine, m-sulphanilic acid or o-aminophenol, or o-toluidine with o-aminophenol, o-ethylaniline, o-phenylene diamine or with amino anthracenes.

Other polymers of an amino substituted aromatic compound which can be used include substituted or unsubstituted polyaminonapthalenes, polyaminoanthracenes, polyaminophenanthrenes, etc. and polymers of any other condensed polyaromatic compound. Polyaminoanthracenes and methods of making them are disclosed in U.S. Pat. No. 6,153,726. The aromatic rings can be unsubstituted or substituted e.g. by a group R as defined above.

The polyanilines can be deposited on the first electrode by conventional methods e.g. by vacuum evaporation, spin coating, chemical deposition, direct electrodeposition etc. preferably the thickness of the polyaniline layer is such that the layer is conductive and transparent and can is preferably from 20 nm to 200 nm. The ployanilines can be doped or undoped, when they are doped they can be dissolved in a solvent and deposited as a film, when they are undoped they are solids and can be deposited by vacuum evaporation i.e. by sublimation.

The structural formulae of some other hole transmitting materials are shown in FIGS. 1, 2, 3, 4 and 5 of the drawings, where R, $R_1$, $R_2$ and $R_3$ can be the same or different and are selected from hydrogen, and substituted and unsubstituted hydrocarbyl groups such as substituted and unsubstituted aliphatic groups, substituted and unsubstituted aromatic, heterocyclic and polycyclic ring structures, fluorocarbons such as trifluoryl methyl groups, halogens such as fluorine or thiophenyl groups; $R_1$, $R_2$ and $R_3$ can also form substituted and unsubstituted fused aromatic, heterocyclic and polycyclic ring structures and can be copolymerisable with a monomer e.g. styrene. X is Se, S or O, Y can be hydrogen, substituted or unsubstituted hydrocarbyl groups, such as substituted and unsubstituted aromatic, heterocyclic and polycyclic ring structures, fluorine, fluorocarbons such as trifluoryl methyl groups, halogens such as fluorine or thiophenyl groups or nitrile.

Examples of $R_1$ and/or $R_2$ and/or $R_3$ include aliphatic, aromatic and heterocyclic alkoxy, aryloxy and carboxy groups, substituted and substituted phenyl, fluorophenyl, biphenyl, phenanthrene, anthracene, naphthyl and fluorene groups alkyl groups such as t-butyl, heterocyclic groups such as carbazole.

The hole transporting material can optionally be mixed with the electroluminescent material in a ratio of 5–95% of the electroluminescent material to 95 to 5% of the hole transporting compound.

Other hole transporting materials which can be used are conjugated polymers.

U.S. Pat. No. 5,807,627 discloses an electroluminescence device in which there are conjugated polymers in the electroluminescent layer. The conjugated polymers referred to are defined as polymers for which the main chain is either fully conjugated possessing extended pi molecular orbitals along the length of the chain or else is substantially conjugated, but with interruptions to conjugation, either random or regular along the main chain. They can be homopolymers or copolymers.

The conjugated polymer used can be any of the conjugated polymers disclosed or referred to in U.S. Pat. No. 5,807,627, PCT/WO90/13148 and PCT/WO92/03490.

The conjugated polymers disclosed are poly (p-phenylenevinylene)-PPV and copolymers including PPV. Other preferred polymers are poly(2,5 dialkoxyphenylene vinylene) such as poly (2-methoxy-5-(2-methoxypentyloxy-1,4-phenylene vinylene), poly(2-methoxypentyloxy)-1,4-phenylenevinylene), poly(2-methoxy-5-(2-dodecyloxy-1,4-phenylenevinylene) and other poly(2,5 dialkoxyphenylenevinylenes) with at least one of the alkoxy groups being a long chain solubilising alkoxy group, poly fluorenes and oligofluorenes, polyphenylenes and oligophenylenes, polyanthracenes and oligo anthracenes, ploythiophenes and oligothiophenes.

In PPV the phenylene ring may optionally carry one or more substituents e.g. each independently selected from alkyl, preferably methyl, alkoxy, preferably methoxy or ethoxy.

Any poly(arylenevinylene) including substituted derivatives thereof can be used and the phenylene ring in poly(p-phenylenevinylene) may be replaced by a fused ring system such as anthracene or naphthlyene ring and the number of vinylene groups in each polyphenylenevinylene moeity can be increased e.g. up to 7 or higher.

The conjugated polymers can be made by the methods disclosed in U.S. Pat. No. 5,807,627, PCT/WO90/13148 and PCT/WO92/03490.

The hole transmitting material and the light emitting metal compound can be mixed to form one layer e.g. in an proportion of 5 to 95% of the hole transmitting material to 95 to 5% of the light emitting metal compound.

Figure 6:
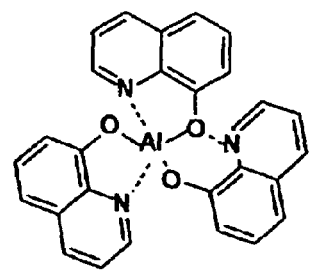
FIGS. 6–7 show exemplary electron transporting materials in accordance with this invention.
Figure 6:
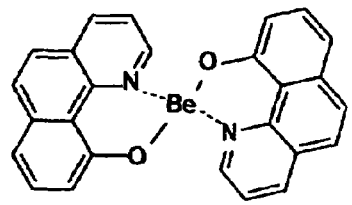
Figure 6:
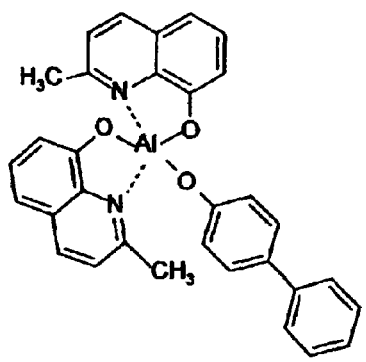
Figure 6:
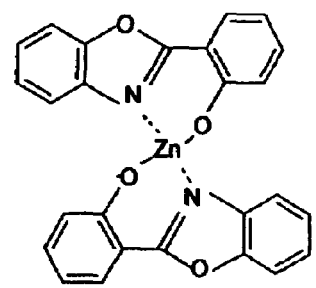
Figure 6:
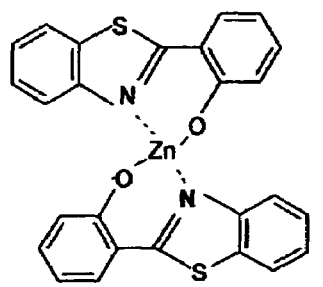
Figure 6:
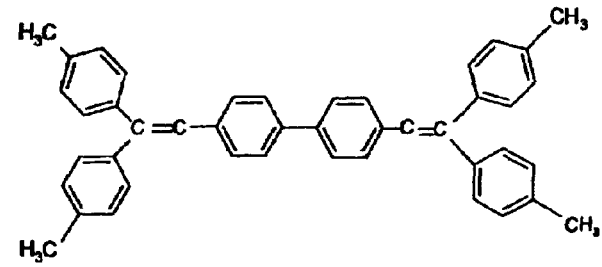
Figure 7:
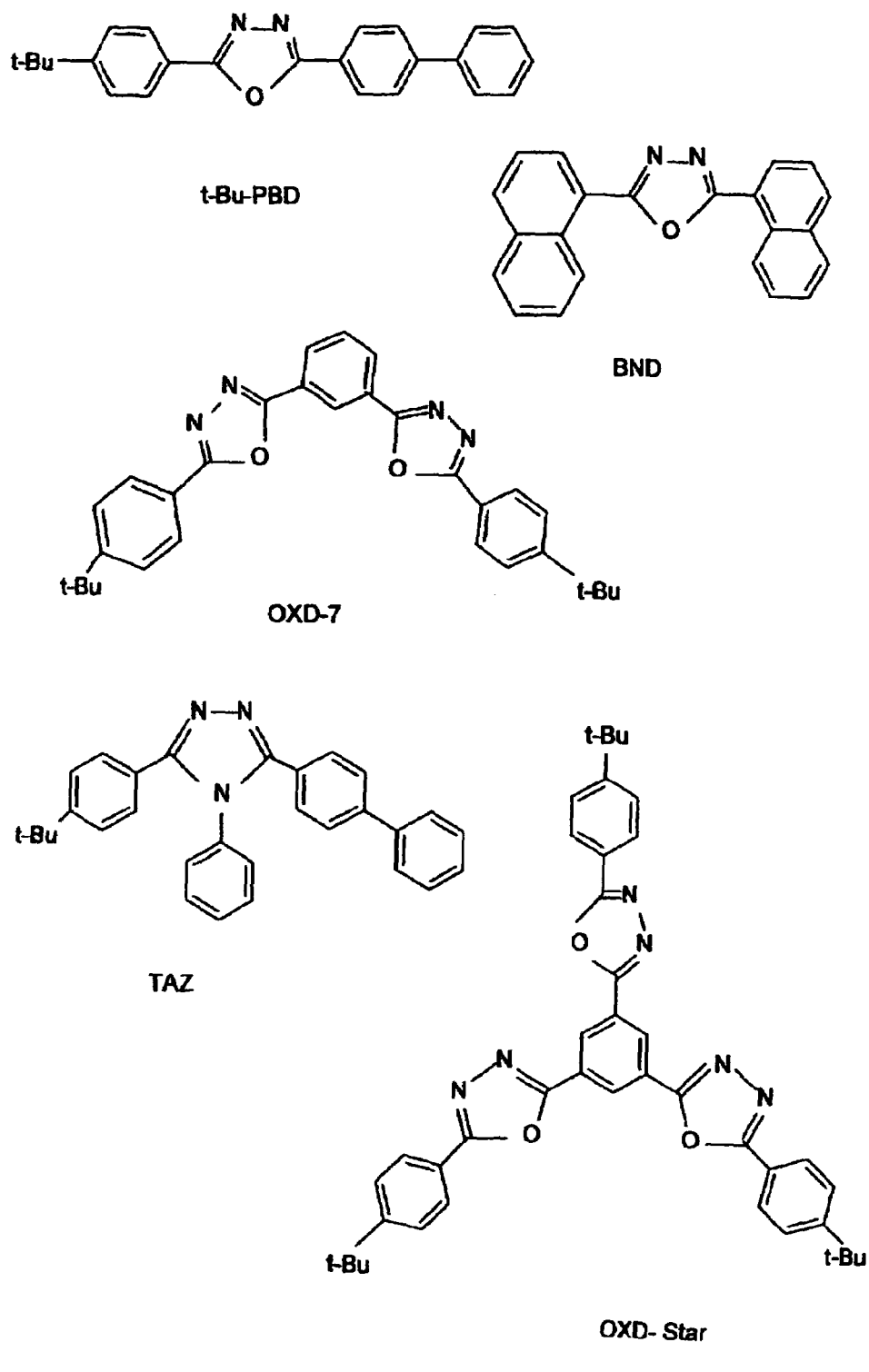

Optionally there is a layer of an electron transmitting material between the cathode and the electroluminescent material layer, the electron transmitting material is a material which will transport electrons when an electric current is passed through electron transmitting materials include a metal complex such as a metal quinolate e.g. an aluminium quinolate, lithium quinolate a cyano anthracene such as 9,10 dicyano anthracene, a polystyrene sulphonate and compounds of formulae shown in FIGS. 6 and 7. Other electron transmitting materials which can be used include metal dibenzoyl methanes such as aluminium and scandium dibenzoyl methane, Al or Sc(DBM)$_3$. Where the electron transmitting material is electroluminescent it is preferably used in a layer which is too thin to affect the electroluminescent properties of the device. Instead of being a separate layer the electron transmitting material can be mixed with the electroluminescent material to form one layer e.g. in a proportion of 5 to 95% of the electron transmitting material to 95 to 5% of the light emitting metal compound.

The electroluminescent layer can comprise a mixture of the light emitting metal compound with the hole transmitting material and electron transmitting material.

The electroluminescent material can be deposited on the substrate directly by vacuum evaporation or evaporation from a solution in an organic solvent. The solvent which is used will depend on the material but chlorinated hydrocarbons such as dichloromethane and n-methylpyrrolidone; dimethyl sulphoxide; tetra hydrofuran; dimethylformamide etc. are suitable in many cases.

Alternatively electroluminescent material can be deposited by spin coating from solution, or by vacuum deposition from the solid state e.g. by sputtering, or any other conventional method can be used.

Preferably the first electrode is a transparent substrate such as a conductive glass or plastic material which acts as the anode, preferred substrates are conductive glasses such as indium tin oxide coated glass, but any glass which is conductive or has a transparent conductive layer such as a metal or conductive polymer can be used.

Conductive polymers and conductive polymer coated glass or plastics materials can also be used as the substrate.

The second electrode functions as the cathode and can be any low work function metal e.g. aluminium, calcium, lithium, silver/magnesium alloys etc., aluminium is a preferred metal.

The display of the invention may be monochromatic or polychromatic. Electroluminescent rare earth chelate compounds are known which will emit a range of colours e.g. red, green, and blue light and white light and examples are disclosed in Patent Applications WO98/58037 PCT/GB98/01773, PCT/GB99/03619, PCT/GB99/04030, PCT/GB99/04024, PCT/GB99/04028, PCT/GB00/00268 and can be used to form OLEDs emitting those colours. Thus, a full colour display can be formed by arranging three individual backplanes, each emitting a different primary monochrome colour, on different sides of an optical system, from another side of which a combined colour image can be viewed. Alternatively, rare earth chelate electroluminescent compounds emitting different colours can be fabricated so that adjacent diode pixels in groups of three neighbouring pixels produce red, green and blue light. In a further alternative, field sequential colour filters can be fitted to a white light emitting display.

Either or both electrodes can be formed of silicon and the electroluminescent material and intervening layers of a hole transporting and electron transporting materials can be formed as pixels on the silicon substrate. Preferably each pixel comprises at least one layer of a rare earth chelate electroluminescent material and an (at least semi-) transparent electrode in contact with the organic layer on a side thereof remote from the substrate.

Preferably, the substrate is of crystalline silicon and the surface of the substrate may be polished or smoothed to produce a flat surface prior to the deposition of electrode, or electroluminescent compound. Alternatively a non-planarised silicon substrate can be coated with a layer of conducting polymer to provide a smooth, flat surface prior to deposition of further materials.

In one embodiment, each pixel comprises a metal electrode in contact with the substrate. Depending on the relative work functions of the metal and transparent electrodes, either may serve as the anode with the other constituting the cathode.

When the silicon substrate is the cathode an indium tin oxide coated glass can act as the anode and light is emitted through the anode. When the silicon substrate acts as the anode the cathode can be formed of a transparent electrode which has a suitable work function, for example by a indium zinc oxide coated glass in which the indium zinc oxide has a low work function. The anode can have a transparent coating of a metal formed on it to give a suitable work function. These devices are sometimes referred to as top emitting devices or back emitting devices.

The metal electrode may consist of a plurality of metal layers, for example a higher work function metal such as aluminium deposited on the substrate and a lower work function metal such as calcium deposited on the higher work function metal. In another example, a further layer of conducting polymer lies on top of a stable metal such as aluminium.

Preferably, the electrode also acts as a mirror behind each pixel and is either deposited on, or sunk into, the planarised surface of the substrate. However, there may alternatively be a light absorbing black layer adjacent to the substrate.

In still another embodiment, selective regions of a bottom conducting polymer layer are made non-conducting by exposure to a suitable aqueous solution allowing formation of arrays of conducting pixel pads which serve as the bottom contacts of the pixel electrodes.

As described in WO00/60669 the brightness of light emitted from each pixel is preferably controllable in an analogue manner by adjusting the voltage or current applied by the matrix circuitry or by inputting a digital signal which is converted to an analogue signal in each pixel circuit. The substrate preferably also provides data drivers, data converters and scan drivers for processing information to address the array of pixels so as to create images. When an electroluminescent material is used which emits light of a different colour depending on the applied voltage the colour of each pixel can be controlled by the matrix circuitry.

In one embodiment, each pixel is controlled by a switch comprising a voltage controlled element and a variable resistance element, both of which are conveniently formed by metal-oxide-semiconductor field effect transistors (MOSFETs) or by an active matrix transistor.

EXAMPLE 1

Synthesis of 1-phenyl-3-methyl-4-trimethylacetyl pyrazol-5-one (TMAP) from 1-phenyl-3-methylpyrazol-5-one 1-phenyl-3-methylpyrazol-5-one (25.0 g) was dissolved with warming in 235.3 ml of dioxane in 500 ml 3-neck quick-fit round bottom flask carrying a reflux condenser, a dropping funnel and stirrer. The solution was cooled to room temperature. 29.4 g of dry calcium hydroxide was added to the solution and stirred. 17.7 ml of trimethylacetyl chloride was added dropwise to the mixture in the flask with vigorous stirring within 15 mm. The mole ratio of pyrazolone and trimethylacetyl chloride is 1:1. The hot reaction mixture was stirred without heating for 40 mm and resultant orange mixture was poured into 1176 ml of chilled 3 M HCl with stirring to decompose the calcium product. The product was extracted into $CH_2Cl_2$ and the solvent was evaporated to obtain the crude product. Then the pure product was isolated as reddish-brown solution using column chromatography eluted with diethyl ether-pet. ether (60–80° C.) (3:2). The solvent mixture was evaporated and oily product was kept in refrigerator to solidify. mp 98° C. Elemental analysis of the product. Found: C, 69.47%; H, 7.00%; N, 10.69%. Cal. for ($C_{15}H_{~8}N_2O_2$): C, 69.76%; H, 6.98%; N, 10.85%

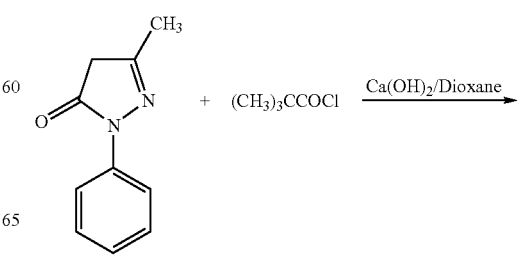

-continued

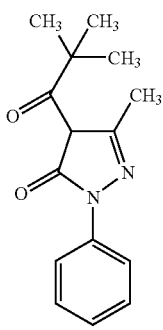

EXAMPLE 2

Synthesis of 4-tert-Butyl-3-methyl-1-phenylpyrazol-5-one

3-Methyl-1-phenylpyrazol-5-one (5 g; 0.029 mole) was placed in a flask equipped with a stirrer and reflux condenser. Dry and distilled dioxane (40 ml) was added by warming and to the clear solution calcium hydroxide (6.4 g; 0.086 mole) was added followed by drop wise addition of tert-butylacetyl chloride (4.8 ml; 0.034 mole). The mixture was heated to reflux for 4 hours and then poured into 2M HCl (200 ml) to decompose the calcium complex. A light brown precipitate formed immediately, which was filtered off under suction after refrigerating overnight. The product was washed with water and dried under vacuum at 50° C. The product was recrystallised from methanol to give an off-white crystalline solid, m.p 85–86° C.; 6.8 g (82%).

| | Elemental Analysis | | |
|---|---|---|---|
| Element | C | H | N |
| % Theory | 70.56 | 7.40 | 10.28 |
| 5 Found | 70.54 | 7.43 | 10.26 |

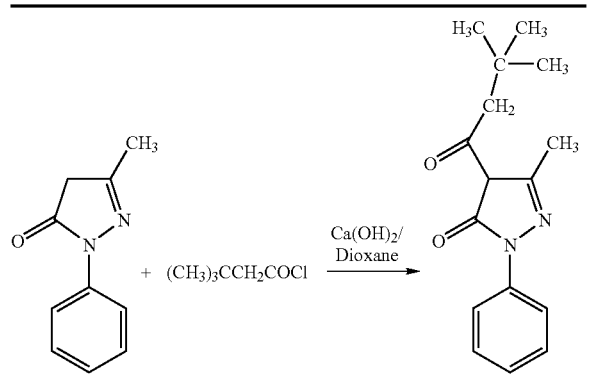

EXAMPLE 3

Synthesis of Aluminium(1-phenyl-3-methyl-4-trimethylacetyl pyrazol-5-one)$_3$ Complex Al(TMAP)$_3$ A solution of 1-phenyl-3-methyl-4-trimethylacetyl pyrazol-5-one (TMAP) (3.9 mM) in ethanol (15 ml) was stirred and neutralised with sodium hydroxide (NaOH) (3.9 mM in 2 ml $H_2O$) solution. To the mixture was added $AlCl_3 \cdot 6H_2O$ (1.3 mM in 2 ml $H_2O$) dropwise at room temperature. Then the mixture was stirred for 5 minutes at room temperature and then warmed for another 5 minutes. The crude product, which simultaneously precipitated from the solution, was collected by filtration and washed with water and ethanol. It was dried at 65° C. for 5 hours. mp 298° C. Elemental analysis of Al complex.

Found: C, 66.64%; H, 6.37%; N, 10.22%. Cal. for Al ($C_{45}H_{54}N_6O_6$) complex: C, 67.66%; H, 6.39%; N, 10.52%.

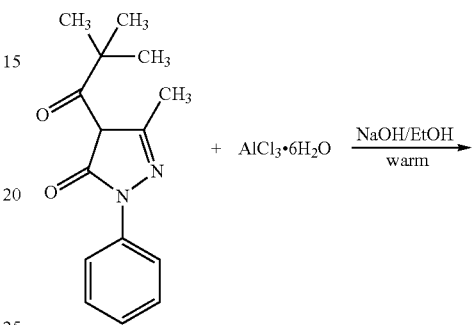

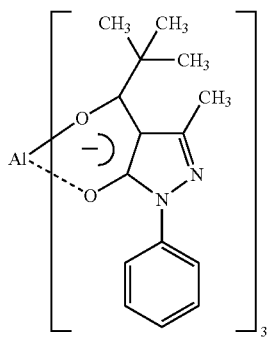

The product is a light-pink colour and showed blue fluorescence.

EXAMPLE 4

Synthesis of tris(4-tert-butylacetyl-3-methyl-1-phenylpyrazol-onato), Al(pyr)$_3$ 4-tert-Butylacetyl-3-methyl-1-phenylpyrazol-5-one (2.0 g; 0.0074 mole) was dissolved in ethanol (25 ml) and to the stirred solution added aluminium chloride hexahydrate (0.6 g; 0.0025 mole) in water (5 ml). A precipitate formed within 5 minutes. The reaction mixture was stirred at room temperature for 18 hours and filtered off under Suction. The product was washed thoroughly with de-ionised water and ethanol and dried under vacuum at 70° C. for 10 hours, 1.85 g (53%). M.p 236.5–237° C.

| | Elemental Analysis | | | |
|---|---|---|---|---|
| | Element | | | |
| | C | H | N | Al |
| % Theory | 68.55 | 6.83 | 9.99 | 3.21 |
| % Found | 68.97 | 6.89 | 10.01 | 3.26 |

Thermal Analysis:

DSC analysis showed an onset melting point of 231° C. and the peak melting at 236° C.

IR (KBr) spectra showed major absorptions appearing at 2943, 1607, 1488, 1431, 1080 and 753 cm'

The compound showed a blue fluorescence under UV lamp.

PL Measurement:

PL spectra was measured by Lot Oriel Multispec Model 77400 CCD Camera.

A The measurement was carried out from the powder by spreading the powder on a spectrosil plate.

PL efficiency: 0.034 cd m$^{-2}$ μlW$^{-1}$

Colour co-ordinates: x 0.19; y 0.21

Peak maximum: 450 nm (FWHM~110 nm).

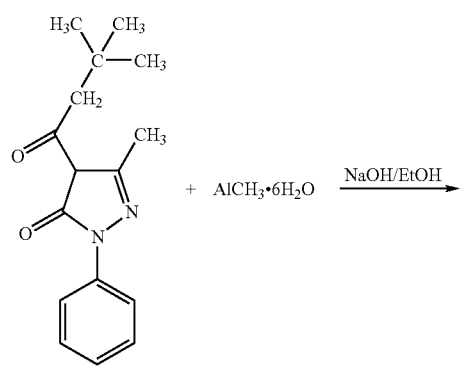

+ AlCH$_3$·6H$_2$O →(NaOH/EtOH)

-continued

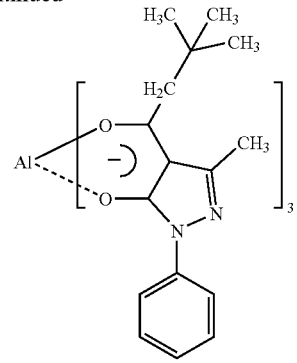

EXAMPLE 5

By the methods of Examples 1 and 3 the aluminium pyrazolones in below were synthesized.

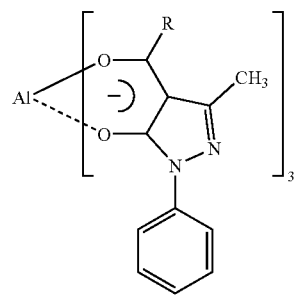

where R is as in the Table 1.

TABLE 1

| Compound | M.pt.(° C.) | PL efficiency cdm$^{-2}$μW$^{-1}$ | Colour coord [x;y] | Comments |
| --- | --- | --- | --- | --- |
| R = CH$_2$—(phenyl) | 142 | 0.011 | 0.24; 0.34 | Peak maximum ~500 nm FWHM~130 nm |
| R = CH$_2$—CH$_2$(phenyl) | 160 | 0.009 | 0.22; 0.25 | Peak maximum ~460 nm FWHM~110 nm |
| R = CH$_2$—CH(CH$_3$)$_2$ | 243–244 | 0.007 | 0.20; 0.21 | Peak maximum ~450 nm FWHM~100 nm |
| R = CH$_2$—C(CH$_3$)$_3$ | 236.5–237 | 0.034 (material was spread on a spectrosil) | 0.19; 0.21 | |

TABLE 1-continued

| Compound | M.pt.(° C.) | PL efficiency cdm$^{-2}$μW$^{-1}$ | Colour coord [x;y] | Comments |
|---|---|---|---|---|
| R = CH$_2$  | 236 DSC, analysis 236 (peak) 232 (onset) | 0.03 (material was spread on a spectrosil) | 0.19; 0.21 | Peak maximum ~450 nm. |
| R = CH$_3$ | | 0.01 | 0.21; 0.26 | |
| R = CH$_2$CH$_3$ | 183 | 0.01 | 0.20; 0.21 | |
| R =  | | 0.009 | 0.24; 0.31 | |
| R = CH$_2$ 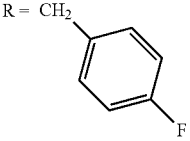 | | 0.011 | 0.23; 0.29 | |

The PL Efficiencies were measured as in example 4.

EXAMPLE 6

Device Fabrication

An ITO coated glass piece (1×1 cm$^2$) had a portion etched out with concentrated hydrochloric acid to remove the ITO and was cleaned and dried. The device was fabricated by sequentially forming on the ITO, by vacuum evaporation, layers comprising:
ITO(100Ω/sqr. m)/CuPc (2.5 mg; ~7.8 nm)/TPD (10.4 mg; ~44.8 nm)/Al(TMAP)$_3$ (10.6 mg; ~61.6)nm)/LiF (0.59 mg; ~2.7 nm)/Al Where ITO is indium titanium oxide coated glass Cu Pc is copper phthalocyanine and TPD is as defined in the specification.

The organic coating on the portion which had been etched with the concentrated hydrochloric acid was wiped with a cotton bud. The coated electrodes were stored in a vacuum desiccator over a molecular sieve and phosphorous pentoxide until they were loaded into a vacuum coater (Edwards, 10$^{-6}$ torr) and aluminium top contacts made. The active area of the LED's was 0.08 cm by 0.1 cm$^2$ the devices were then kept in a vacuum desiccator until the electroluminescence studies were performed.

The ITO electrode was always connected to the positive terminal. The current vs. voltage studies were carried out on a computer controlled Keithly 2400 source meter.

Figure 8:
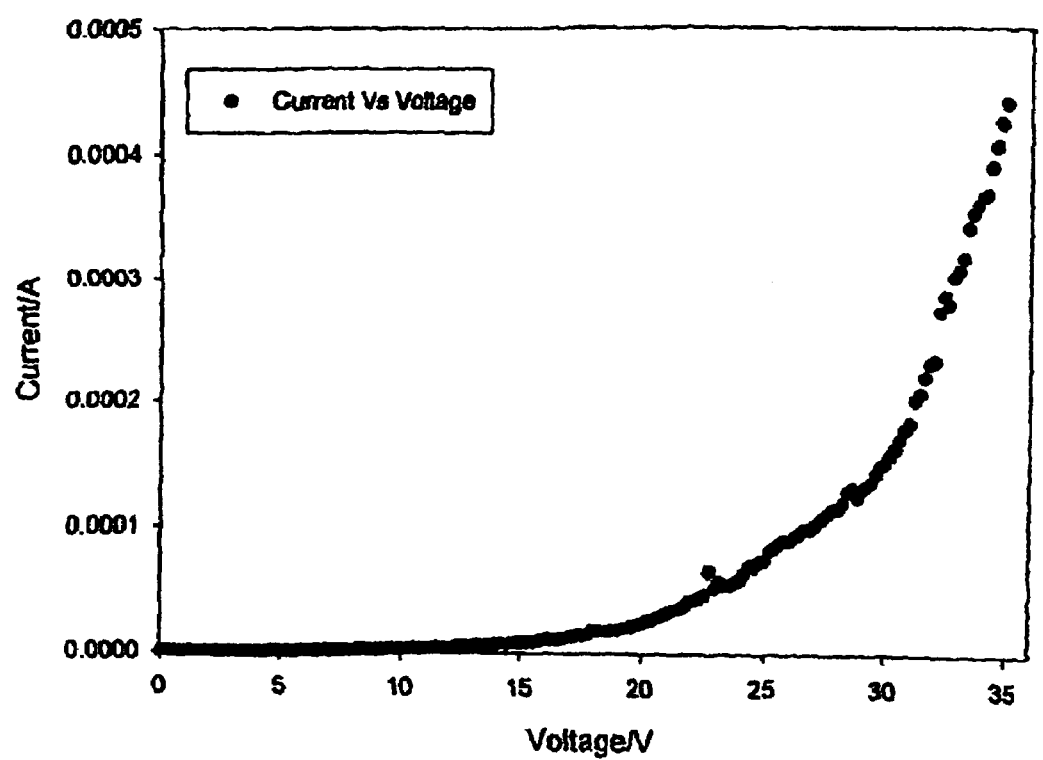
FIG. 8 is a plot of current against voltage for the device of Example 6 in accordance with this invention.
Figure 9:
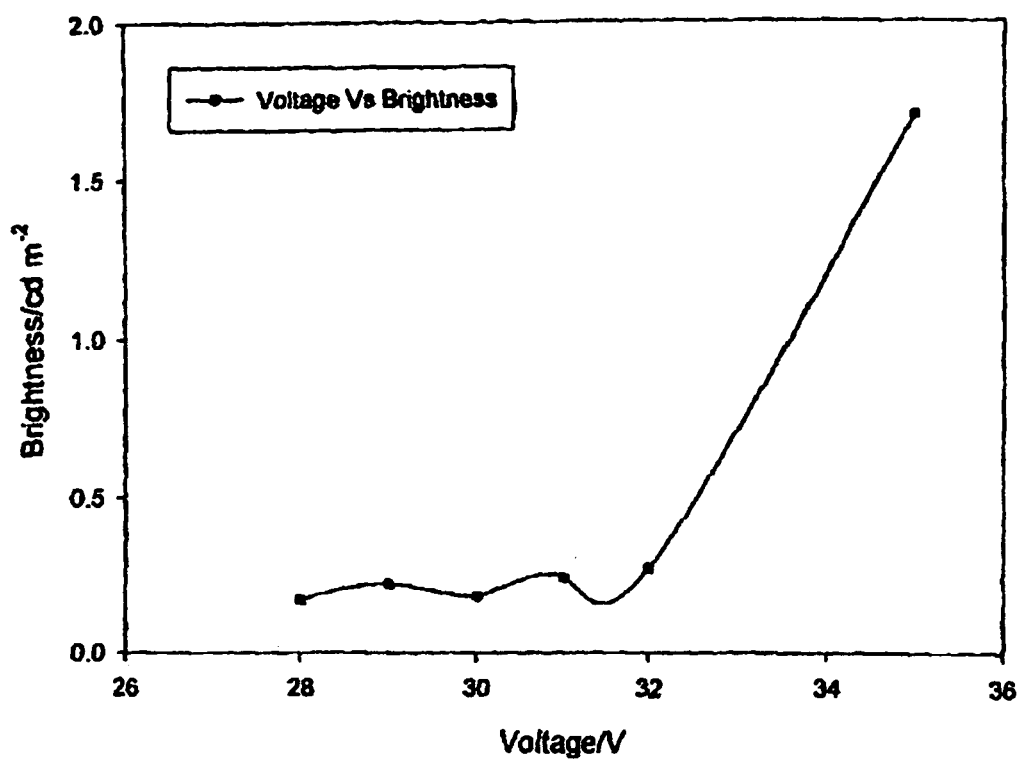
FIG. 9 is a plot of brightness against voltage for the device of Example 6 in accordance with this invention.
Figure 10:
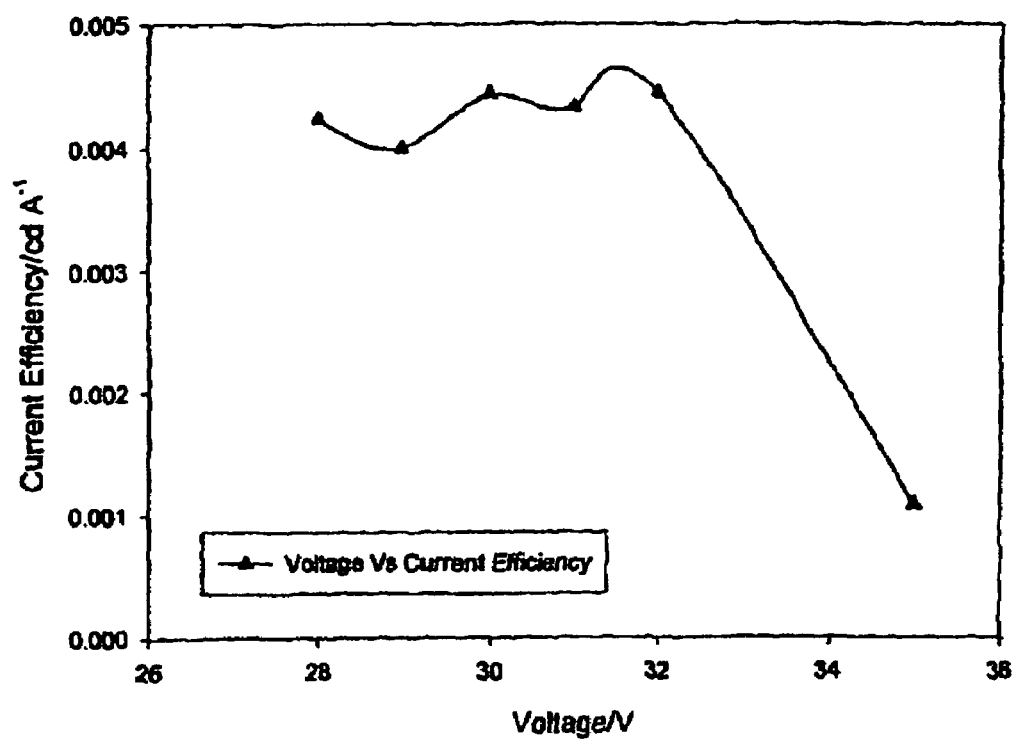
FIG. 10 is a plot of current efficiency against voltage for the device of Example 6 in accordance with this invention.
Figure 11:
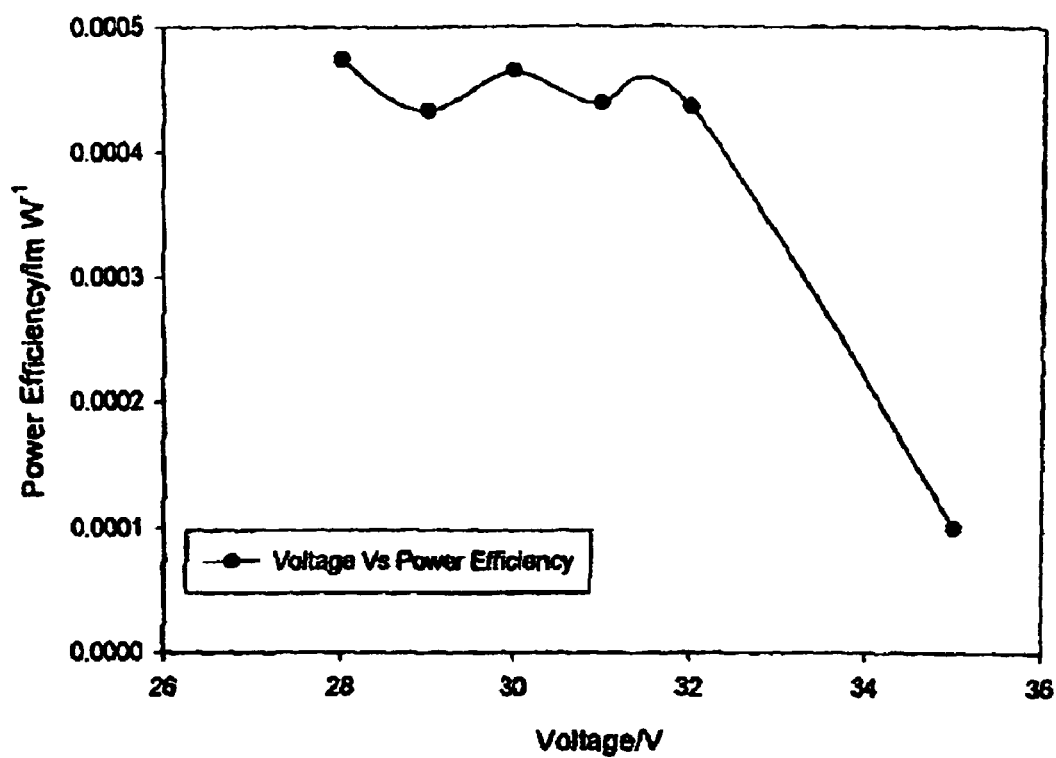
FIG. 11 is a plot of power efficiency against voltage for the device of Example 6 in accordance with this invention.
Figure 12:
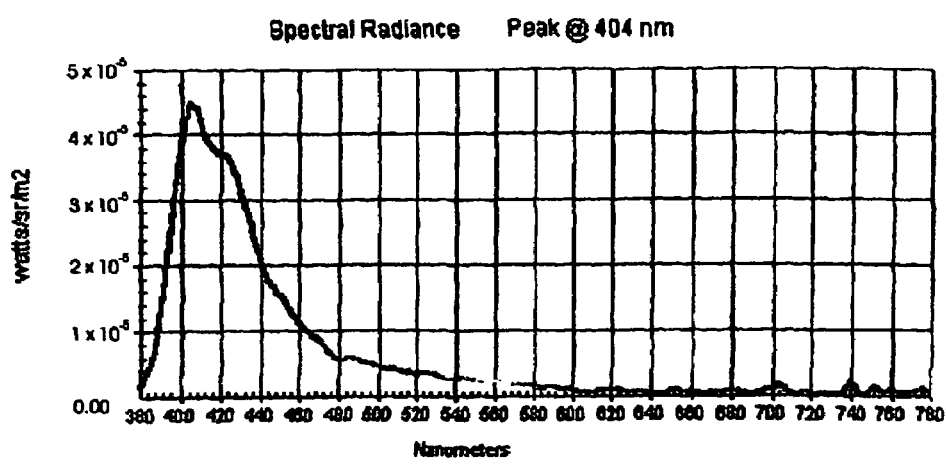
FIG. 12 is an electroluminescence spectrum for the device of Example 6 in accordance with this invention.

An electric current was applied across the device and a plot of the current versus voltage is shown in the graph of FIG. 8, a plot of brightness against voltage shown in FIG. 9, a plot of current efficiency against voltage shown in FIG. 10, a plot of power efficiency against voltage shown in FIG. 11, the electroluminescence spectrum is shown in FIG. 12.

EXAMPLE 7

Figure 13:
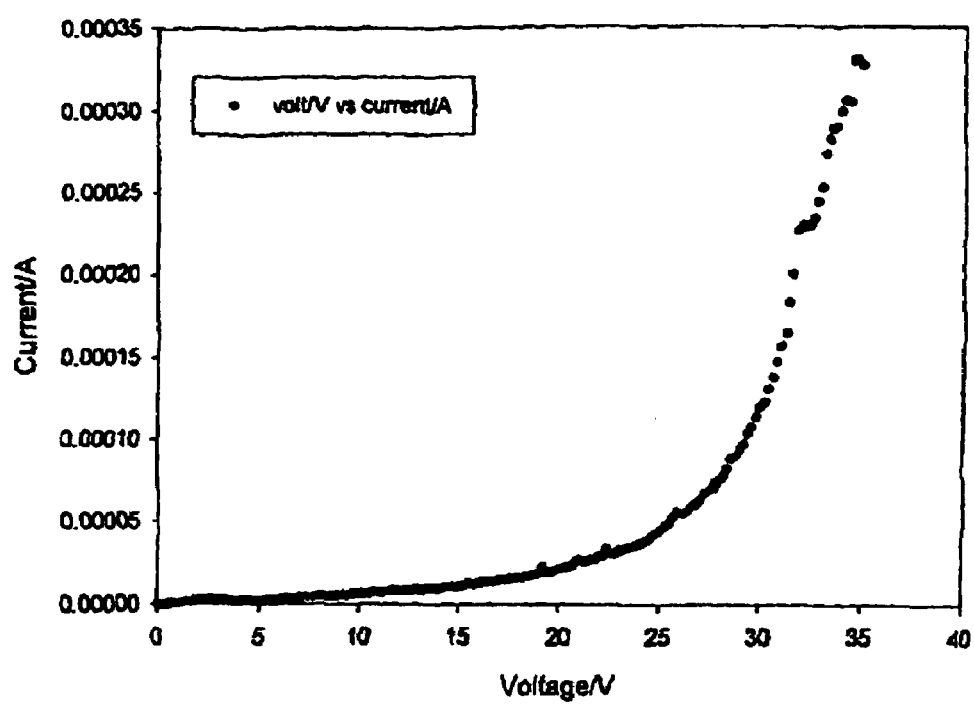
FIG. 13 is a plot of current against voltage for the device of Example 7 in accordance with this invention.

A structure comprising
ITO(100Ω/sq. m)/CuPc(3 mg; ~9.6 nm)/β-NPD(2.8 mg; ~24.4 nm)/Al(TMAP)$_3$ (9.6 mg; ~60.2 nm)/LiF(0.6 mg; ~2.1 nm)/Al was fabricated as in example 5 and the characteristics shown in FIG. 13.

EXAMPLE 8

Figure 14:
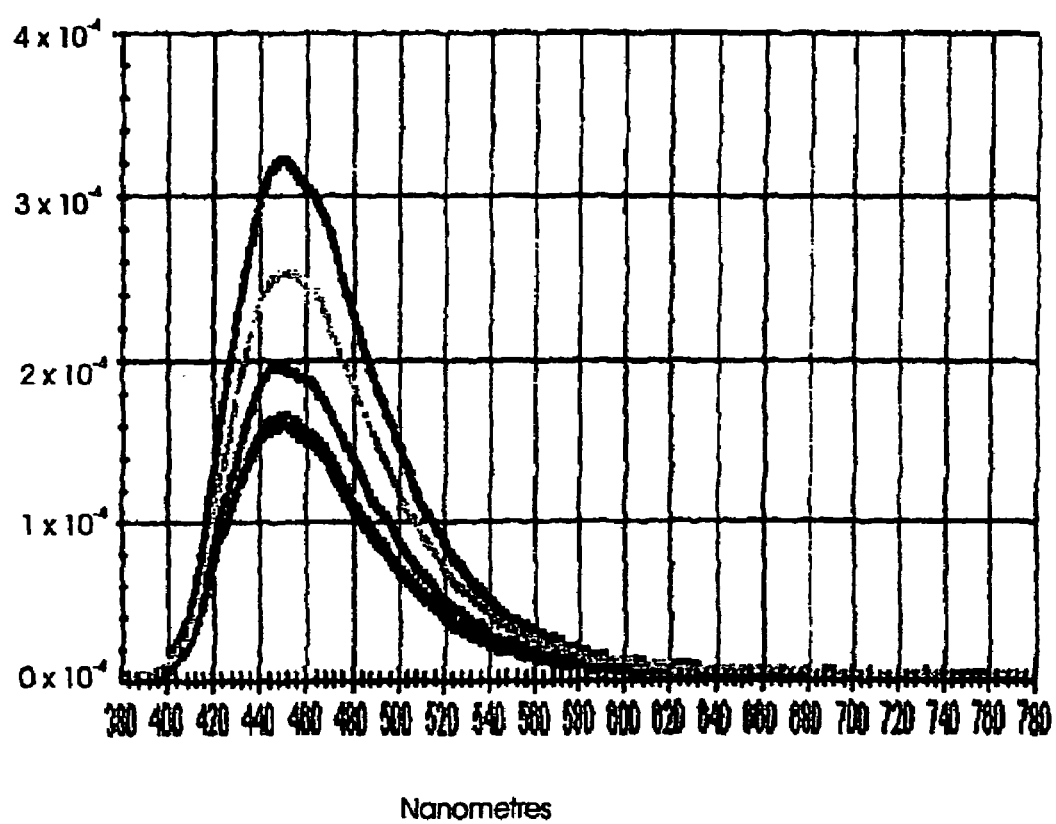
FIG. 14 shows an electroluminescence spectrum for the device of Example 8 in accordance with this invention at different voltages.

A structure comprising
ITO(100Ω/sq. m)/α-NPB(30 nm)/Al(pyr)$_3$ (30 nm)/Alq$_3$(20 nm)/Al was fabricated as in example 6 where the Al(pyr)$_3$ and was made as in example 4; the electroluminescent spectra at different voltages shown in FIG. 14, where

| Voltage/V | Current/mA | Luminance/ cdm$^{-2}$ | x | y | J/mAcm$^{-2}$ | η$_1$/cdA$^{-1}$ | ηEL/lmW$^{-1}$ |
|---|---|---|---|---|---|---|---|
| 25.00 | 0.02 | 1.70 | 0.15 | 0.13 | 0.30 | 0.57 | 0.07 |
| 27.00 | 0.03 | 1.80 | 0.15 | 0.13 | 0.35 | 0.51 | 0.06 |
| 29.00 | 0.04 | 2.20 | 0.15 | 0.13 | 0.46 | 0.48 | 0.05 |
| 31.00 | 0.06 | 3.70 | 0.16 | 0.14 | 0.76 | 0.49 | 0.05 |
| 33.00 | 0.06 | 3.10 | 0.16 | 0.14 | 0.71 | 0.44 | 0.04 |

The x and y co-ordinates are those on the CIE Colour Chart

Figure 15:
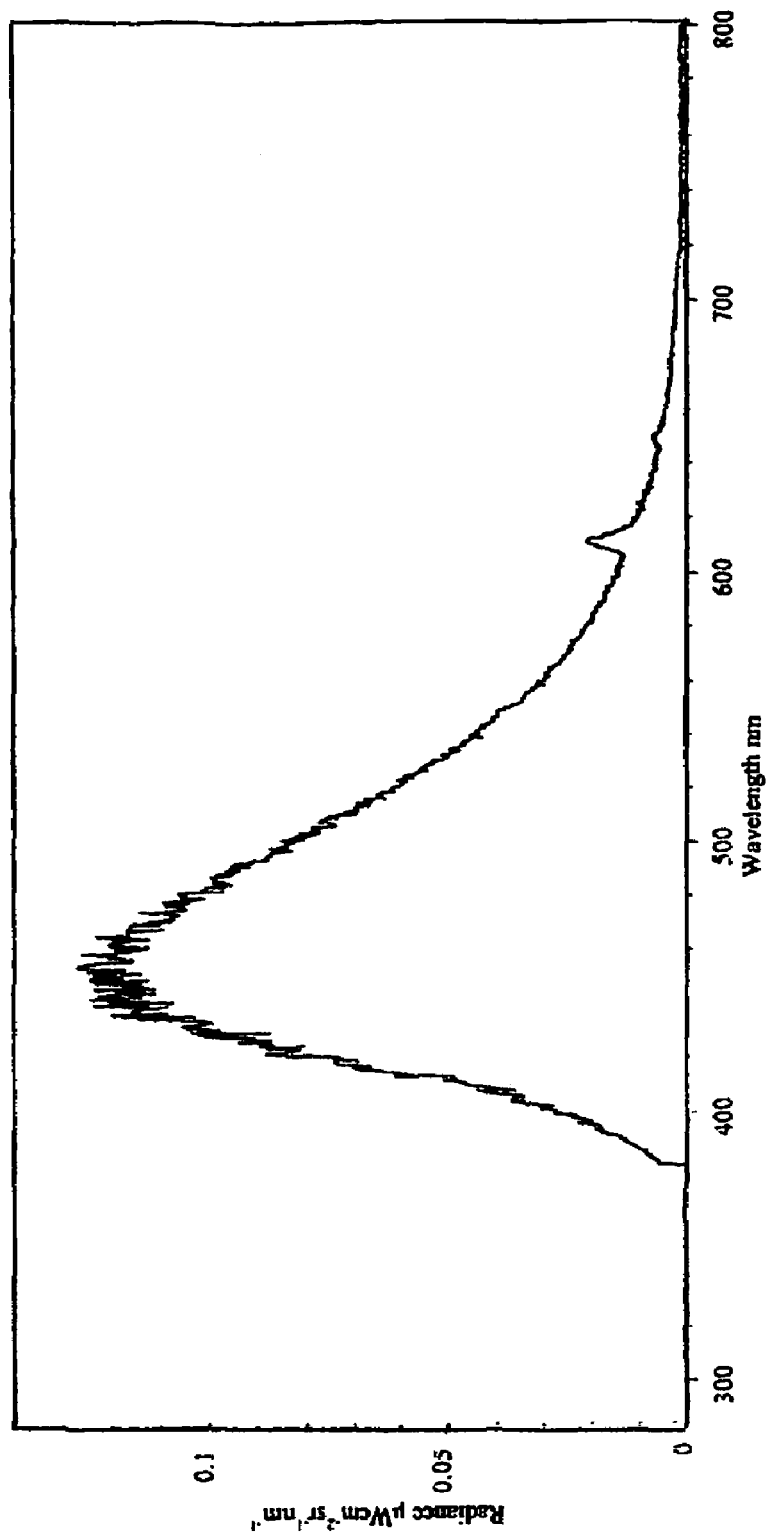
FIG. 15 is a plot of radiance against wavelength for the device of Example 8 in accordance with this invention.
Figure 16:
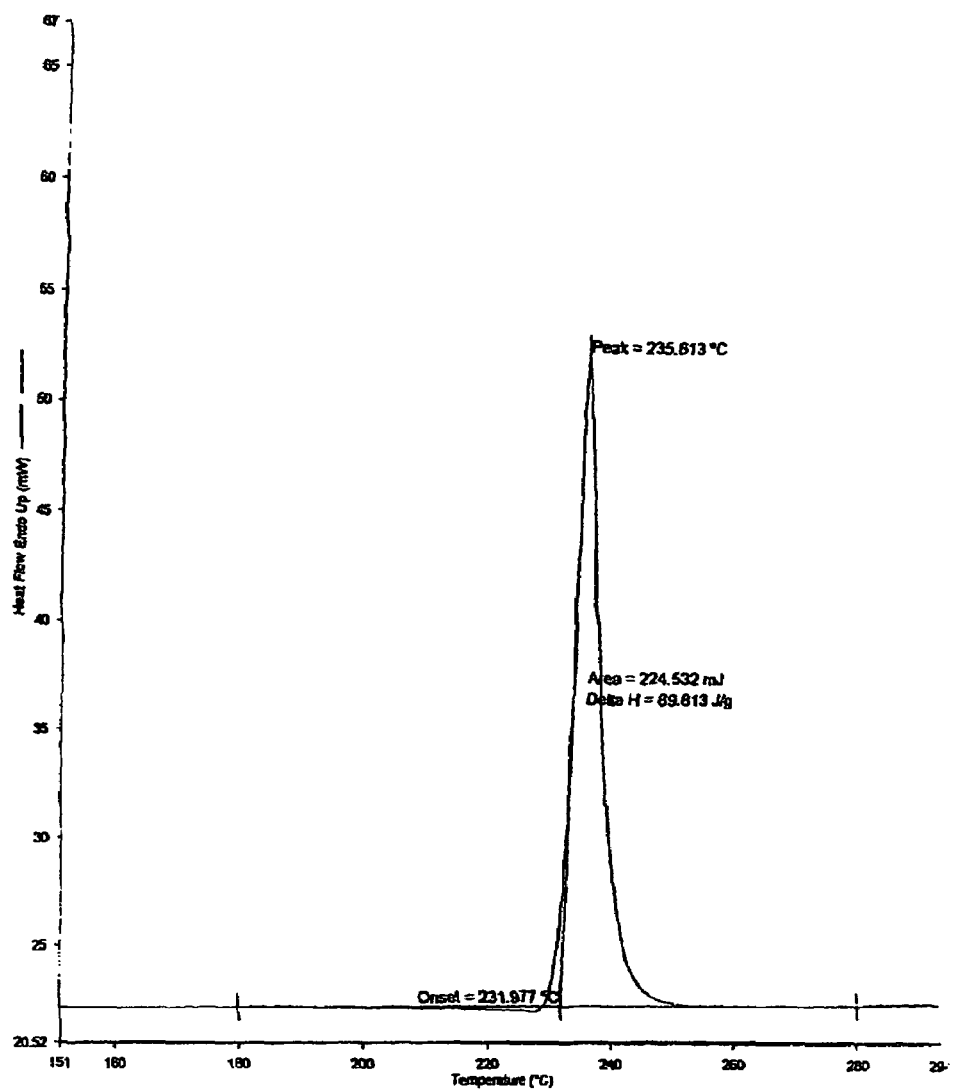
FIG. 16 shows the heat flow characteristics for the device of Example 8 in accordance with this invention.

An electroluminescent spectrum is shown in FIG. 15 and the heat flow characteristics using a PerkinElmer Thermal analysis are shown in FIG. 16 in which the heating was from 50 to 300° C. at 40° C./min and cooling 300 to 50° C./min.

EXAMPLE 9

A structure comprising
ITO(10Ω/sq. m)/CuPc(8 nm)/α-NPB(60 nm)/Al(pyr)$_3$(30 nm)/Alq$_3$(10 nm)/LiF(0.7 nm)/Al was fabricated as in example 6 where the Al(pyr)$_3$ and was made as in example 4 and CuPc is a copper phthalocyanine buffer layer and LiF is lithium fluoride.

The electroluminescence characteristics were measured and the results shown in Table 2.

TABLE 2

| Voltage (V) | Current (mA) | Luminance (cd m$^{-2}$) | Colour Co-ordinate x | Colour Co-ordinate y | Current Efficiency (cd A$^{-1}$) | Memory ID |
|---|---|---|---|---|---|---|
| 7 | 0.16 | 0.33 | 0.16 | 0.11 | 0.21 | |
| 8 | 0.52 | 1.51 | 0.15 | 0.10 | 0.29 | |
| 9 | 1.72 | 5.48 | 0.15 | 0.10 | 0.32 | |
| 11 | 8.7 | 28.9 | 0.15 | 0.10 | 0.32 | M5 |
| 12 | 13.9 | 40.7 | 0.15 | 0.10 | 0.29 | M6 |
| 12.5 | 16.12 | 46 | 0.15 | 0.10 | 0.29 | |
| 13 | 19.3 | 54.1 | 0.15 | 0.10 | 0.28 | |
| 13.5 | 23.5 | 62.3 | 0.15 | 0.10 | 0.26 | |
| 14 | 27.9 | 71.6 | 0.15 | 0.10 | 0.26 | |
| 14.5 | 32.3 | 82 | 0.15 | 0.10 | 0.25 | |
| 15 | 36.2 | 91.3 | 0.15 | 0.10 | 0.25 | |
| 15.5 | 42.5 | 100.7 | 0.15 | 0.10 | 0.24 | |
| 16 | 46.5 | 107.5 | 0.15 | 0.10 | 0.23 | M7 |
| 16.5 | 51.3 | 117.1 | 0.15 | 0.10 | 0.23 | |
| 17 | 57.6 | 94.31 | 0.15 | 0.10 | 0.16 | |

Figure 17:
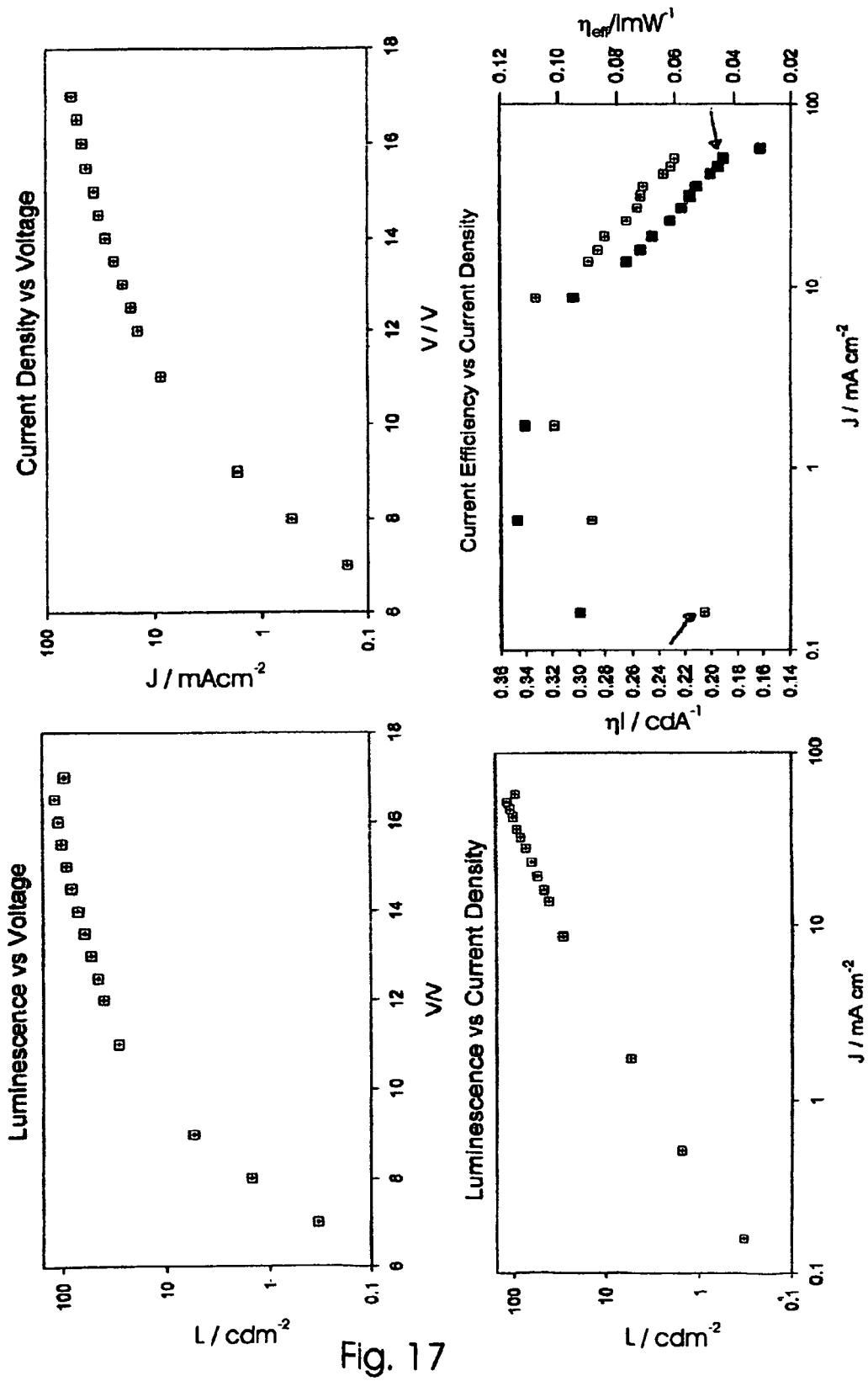
FIG. 17 shows the properties for the device of Example 9 in accordance with this invention.

The properties are shown in graphical form in FIG. 17

EXAMPLE 10

A structure comprising
ITO(10Ω/sq. m)/CuPc(8 nm)/α-NPB(60 nm)/Al(DBM)$_3$(30 nm)/Alq$_3$(10 nm)/LiF(0.7 nm)/Al was fabricated as in example 6 where the Al(pyr)$_3$ and was made as in example 4 Al(DBM)$_3$ is aluminium CuPc is a copper phthalocyanine buffer layer and LiF is lithium fluoride.

Figure 18:
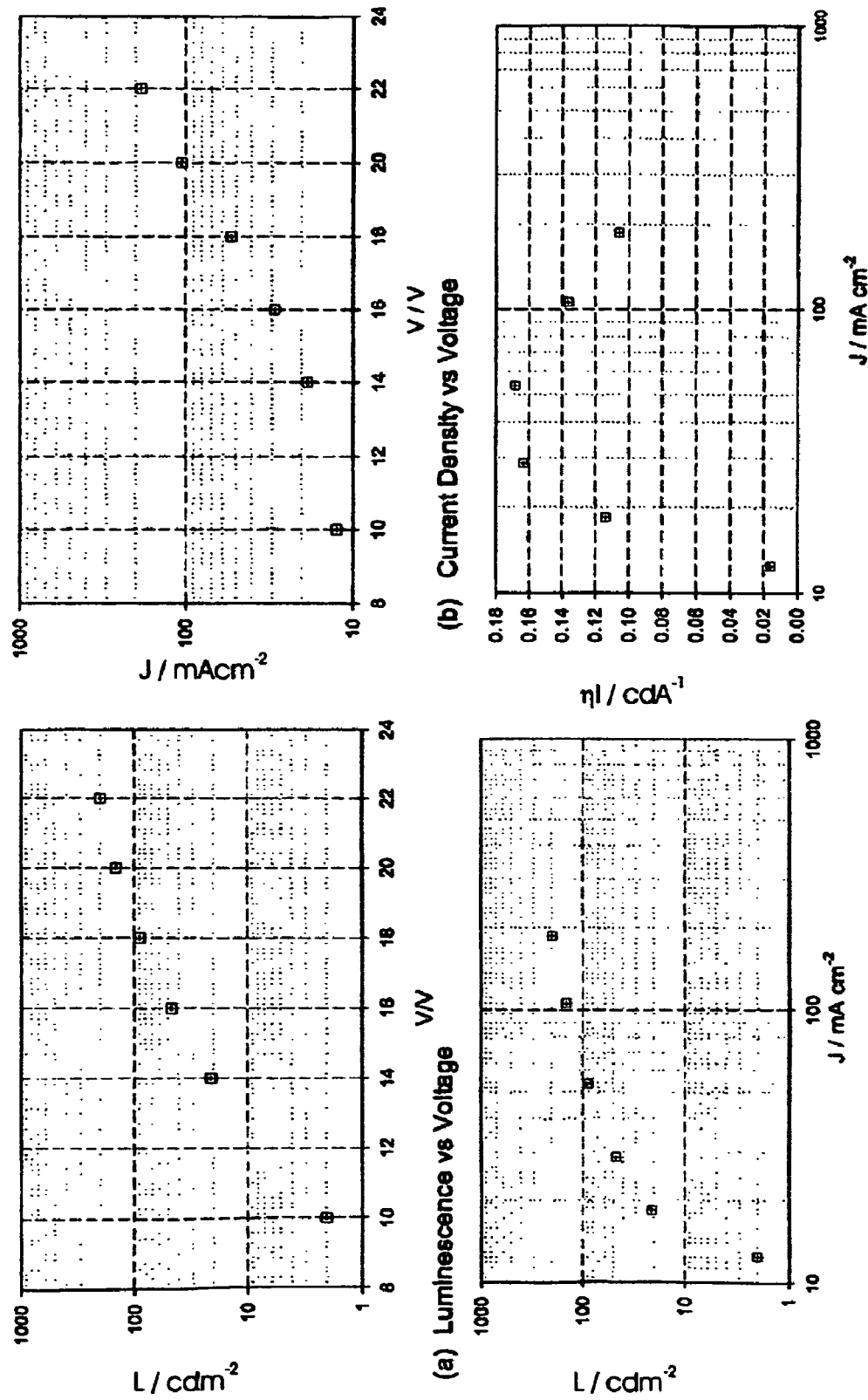
FIG. 18 shows the properties for the device of Example 10 in accordance with this invention.

The properties are shown in FIG. 18

EXAMPLE 11

A structure comprising
ITO(10Ω/sq. m)/CuPc(8 nm)/α-NPB(60 nm)/Al(pyr)$_3$(30 nm)/Liq(10 nm)/LiF(0.7 nm)/Al was fabricated as in example 6 where the Al(pyr)$_3$ and was made as in example 4, Liq is lithium quinolate, CuPc is a copper phthalocyanine buffer layer and LiF is lithium fluoride.

The electroluminescence properties are shown in Table 3

TABLE 3

Figure 19:
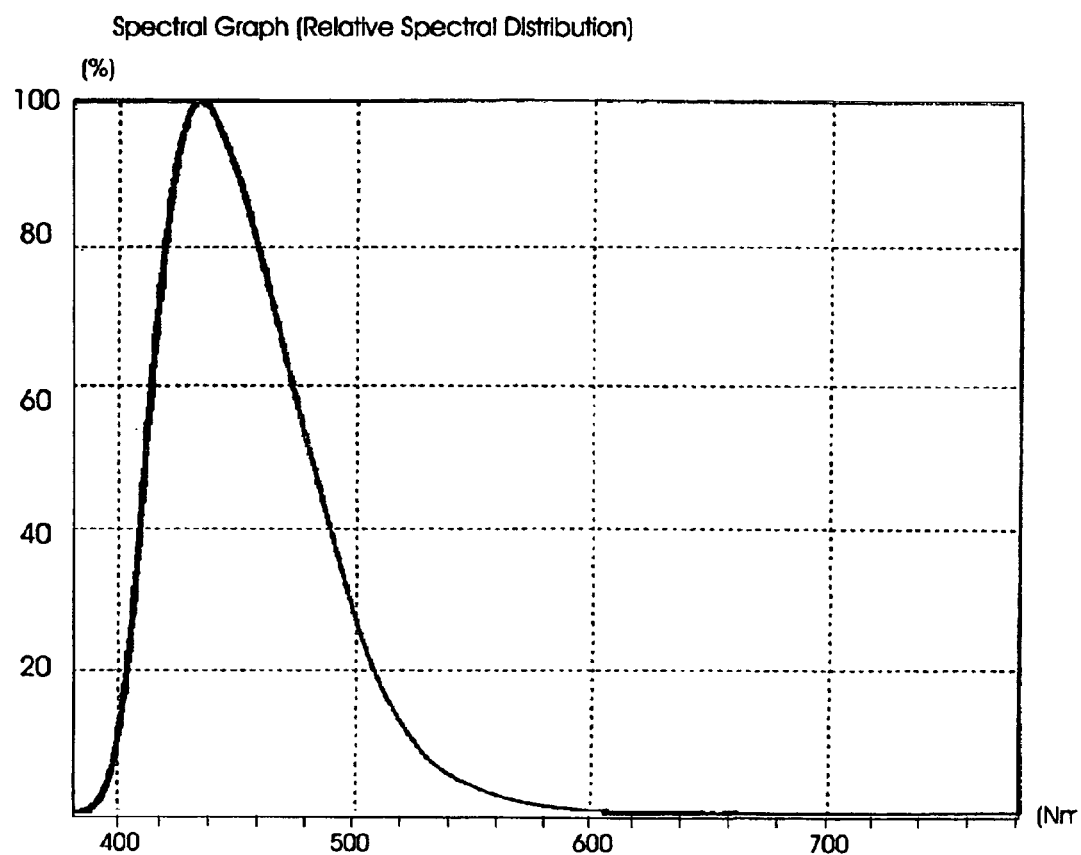
FIG. 19 shows the spectral distribution for the device of Example 11 in accordance with this invention.

| Voltage/V | Current/mA | Luminance/cdm$^{-2}$ | x | y | J/mAcm$^{-2}$ | η$_1$/cdA$^{-1}$ | η$_{EL}$/lmW$^{-1}$ |
|---|---|---|---|---|---|---|---|
| 9 | 4.9 | 0.88 | 0.15 | 0.11 | 61.25 | 1.44 × 10$^{-3}$ | 5.02 × 10$^{-4}$ |
| 10 | 7.09 | 1.77 | 0.15 | 0.10 | 88.63 | 2.00 × 10$^{-3}$ | 6.27 × 10$^{-4}$ | and the relative spectral distribution shown in FIG. 19.

The invention claimed is:

1. An electroluminescent device comprising:
   (i) a first electrode;
   (ii) a second electrode; and,
   (iii) a layer of an electroluminescent material positioned between said first and second electrodes, wherein said electroluminescent material comprises a compound having the following chemical formula:

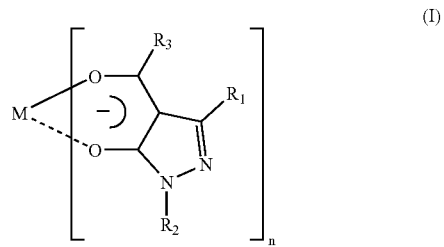

(I)

wherein, in Formula I,
   M is selected from the group consisting of lithium, sodium, potassium, rubidium, caesium, beryllium, magnesium, calcium, strontium, barium, copper, silver, gold, zinc, boron, aluminum, gallium, indium, germanium, tin, antimony, lead, manganese, iron, ruthenium, osmium, cobalt, rhodium, iridium, nickel, palladium, platinum, cadmium and chromium;
   n is the valency of M; and
   $R_1$, $R_2$ and $R_3$ can be the same or different, each being independently selected from the group consisting of hydrogen; substituted or unsubstituted aliphatic groups; substituted or unsubstituted aromatic, heterocyclic or polycyclic ring structures; fluorocarbons; halogens and nitrile groups.

2. The electroluminescent device according to claim 1 wherein M is aluminum, $R_1$ is methyl, $R_2$ is phenyl and $R_3$ is a methyl, ethyl, 2,2-dimethylpropyl, iso-butyl, tert-butyl, benzyl, ethylphenyl, or fluorobenzyl group.

3. The electroluminescent device according to claim 1 wherein $R_3$ is a methyl, ethyl, propyl, butyl or pentyl group.

4. The electroluminescent device according to claim 1 wherein a layer of a hole transmitting material is positioned between the first electrode and the layer of electroluminescent material.

5. The electroluminescent device according to claim 1 wherein a layer of an electron transmitting material is positioned between the second electrode and the layer of electroluminescent material.

6. The electroluminescent device according to claim 1 wherein:
   (i) a layer of a hole transmitting material is located between the first electrode and the layer of the electroluminescent material; and, (ii) a layer of an electron transmitting material is located between the second electrode and the layer of electroluminescent material.

7. The electroluminescent device according to claim 6 wherein the hole transmitting layer is formed from a material selected from the group consisting of:
   a poly(vinylcarbazole) compound;
   a substituted or unsubstituted polyaniline compound;
   N,N'-diphenyl-N,N'-bis(3-methylphenyl)-1,1'-biphenyl-4,4'-diamine (TPD);
   poly(p-phenylenevinylene) and copolymers thereof;
   poly(2,5-dialkoxyphenylene vinylene);
   poly(2-methoxypentyloxy)-1,4-phenylene vinylene);
   a polyfluorene or an oligofluorene compound;
   a polyphenylene or an oligophenylene compound;
   a polyanthracene or an oligoanthracene compound; and,
   a polythiophene or an oligothiophene compound.

8. The electroluminescent device according to claim 6 wherein the electron transmitting material is a metal quinolate or aluminium or scandium dibenzoyl methane.

9. The electroluminescent device according to claim 8 wherein the electron transmitting material is a metal quinolate selected from the group consisting of lithium quinolate, sodium quinolate, potassium quinolate, zinc quinolate, magnesium quinolate and aluminum quinolate.

10. The electroluminescent device according to claim 6 wherein the first and/or the second electrode is formed on a deposition surface of a substrate of crystalline silicon, said deposition surface of the substrate being polished or smoothed to produce a flat surface prior to the deposition of electrode material or the electroluminescent material.

11. The electroluminescent device according to claim 6 wherein the first and/or the second electrode is formed on a surface of a non-planarised silicon substrate.

12. The electroluminescent device according to claim 6 wherein the hole transmitting layer is copper phthalocyanine and the electron transmitting layer is lithium fluoride.

13. The electroluminescent device according to claim 6 wherein the hole transmitting layer is formed from a material selected from the group consisting of:
   a poly(2,5-dialkoxyphenylene vinylene), wherein at least one of the alkoxy groups is a long-chain solubilising alkoxy group;
   poly(2-methoxy-5-(2-methoxypentyloxy)-1,4-phenylene vinylene); and poly(2-methoxy-5(2-dodecyloxy)-1,4-phenylene vinylene).

14. The electroluminescent device according to claim 1 wherein a hole transmitting material and the electroluminescent material are mixed with each other to form one layer having a proportion ranging from about 5 to 95% of the hole transmitting material and, respectively, about 95 to 5% of the electroluminescent material.

15. The electroluminescent device according to claim 1 wherein a electron transmitting material and the electroluminescent material are mixed with each other to form one layer having a proportion ranging from about 5 to 95% of the electron transmitting material and, respectively, about 95 to 5% of the electroluminescent material.

16. An electroluminescent device comprising:
   (i) a first electrode;
   (ii) a second electrode; and
   (iii) a layer of an electroluminescent material positioned between said first and second electrodes, wherein said electroluminescent material is a compound selected from the group of compounds as represented by the following chemical formulas (a) to (h):

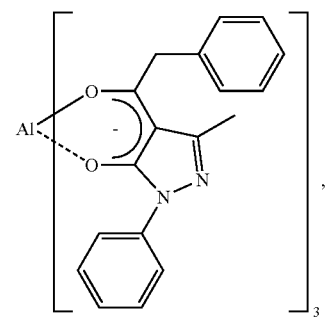
(a)

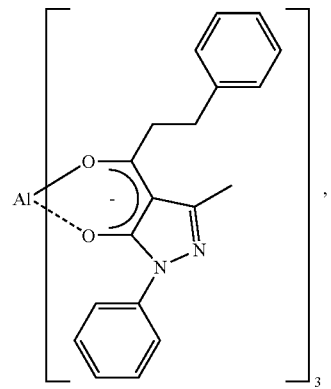
(b)

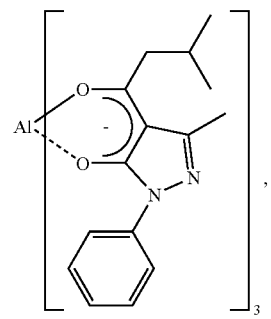
(c)

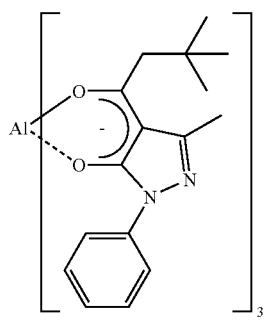
(d)

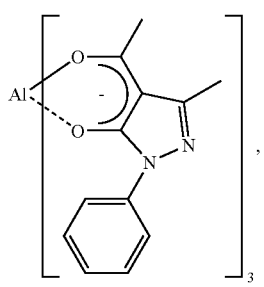 (e)
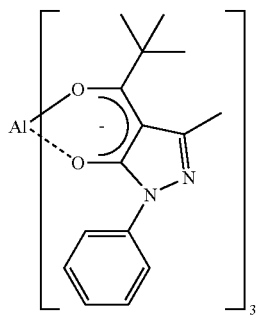 (f)
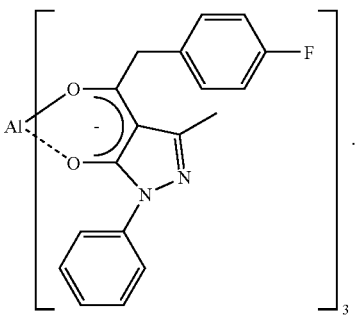 (g)
(h)
* * * * *